United States Patent
Ikeda et al.

(10) Patent No.: US 7,639,096 B2
(45) Date of Patent: Dec. 29, 2009

(54) OSCILLATOR DEVICE AND METHOD FOR MANUFACTURING THE DEVICE

(75) Inventors: Tomoo Ikeda, Tokorozawa (JP); Isao Arai, Kawagoe (JP); Hiroshi Miyauchi, Sayama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 177 days.

(21) Appl. No.: 10/593,542

(22) PCT Filed: Feb. 23, 2005

(86) PCT No.: PCT/JP2005/003429

§ 371 (c)(1),
(2), (4) Date: Sep. 19, 2006

(87) PCT Pub. No.: WO2005/090912

PCT Pub. Date: Sep. 29, 2005

(65) Prior Publication Data

US 2007/0188045 A1    Aug. 16, 2007

(30) Foreign Application Priority Data

Mar. 19, 2004 (JP) ............................. 2004-079368
Mar. 23, 2004 (JP) ............................. 2004-083750
Mar. 23, 2004 (JP) ............................. 2004-083755

(51) Int. Cl.
*H03B 5/36* (2006.01)

(52) U.S. Cl. .................. 331/154; 310/311; 310/348

(58) Field of Classification Search .............. 310/311, 310/348; 331/154
See application file for complete search history.

(56) References Cited

U.S. PATENT DOCUMENTS 6,897,737 B2 * 5/2005 Sakata et al. ............... 331/156
7,096,733 B2   8/2006 Ohta et al.

FOREIGN PATENT DOCUMENTS

| JP | 5-114800 | 5/1993 |
|----|----------|--------|
| JP | 8-65051 | 3/1996 |
| JP | 5-63118 | 8/1996 |
| JP | 10-38579 | 2/1998 |
| JP | 11-230758 | 8/1999 |
| JP | 2001-116551 | 4/2001 |
| JP | 2002-009577 | 1/2002 |
| JP | 2003-214855 | 7/2003 |
| WO | WO 03/100350 A1 | 12/2003 |

* cited by examiner

*Primary Examiner*—Robert Pascal
*Assistant Examiner*—James E Goodley
(74) *Attorney, Agent, or Firm*—Finnegan, Henderson, Farabow, Garrett & Dunner, L.L.P.

(57) ABSTRACT

An object of the present invention is to provide a compact and highly reliable oscillator device having stable vibration characteristics, the object being achieved by constructing the oscillator device by bonding an oscillator in place by accurately positioning it, in a prescribed position and at a prescribed angle, inside a package. The oscillator device according to the present invention includes an oscillator having a vibrating prong and a base portion with a first reference portion, a package, a mounting base with a second reference portion provided inside the package, and a bonding material for fixing the oscillator to the mounting base by aligning the first reference portion with the second reference portion by utilizing a self-alignment effect occurring due to surface tension.

22 Claims, 32 Drawing Sheets

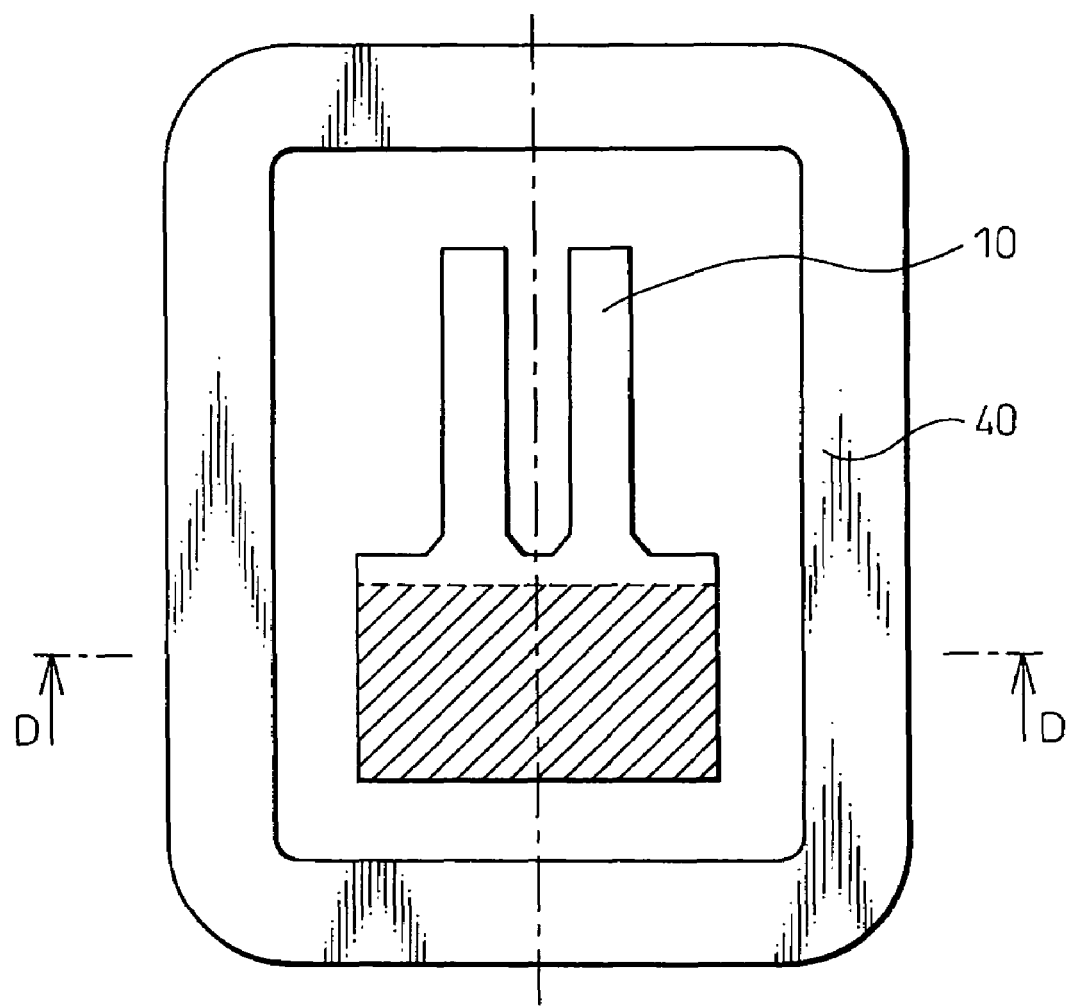

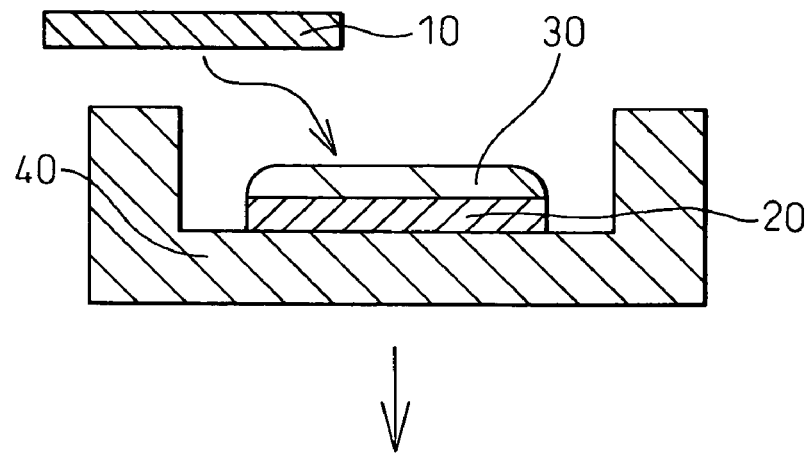
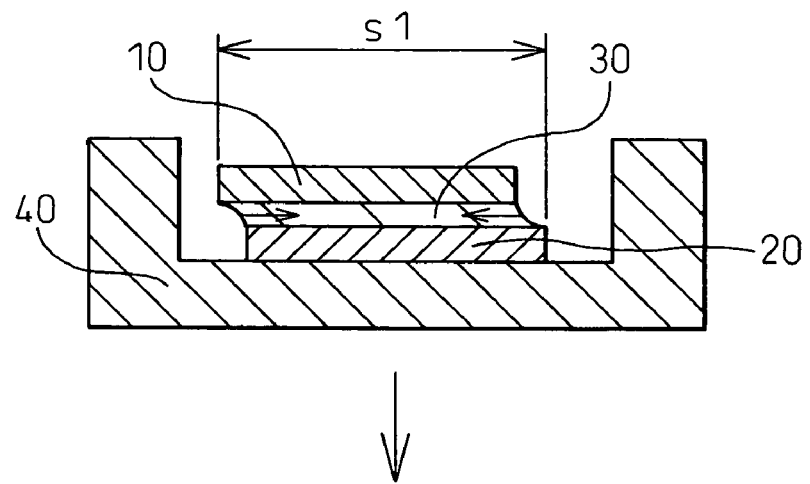
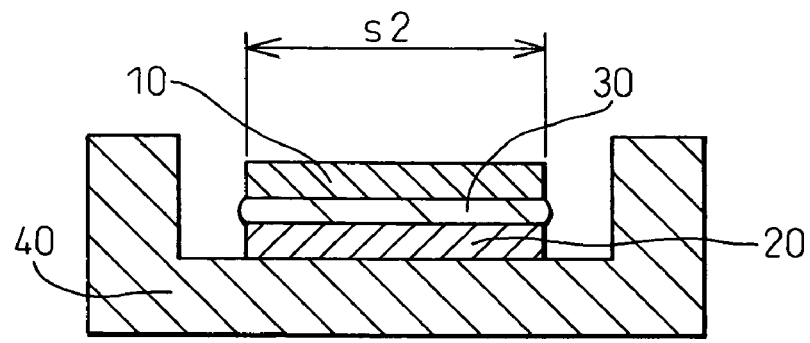

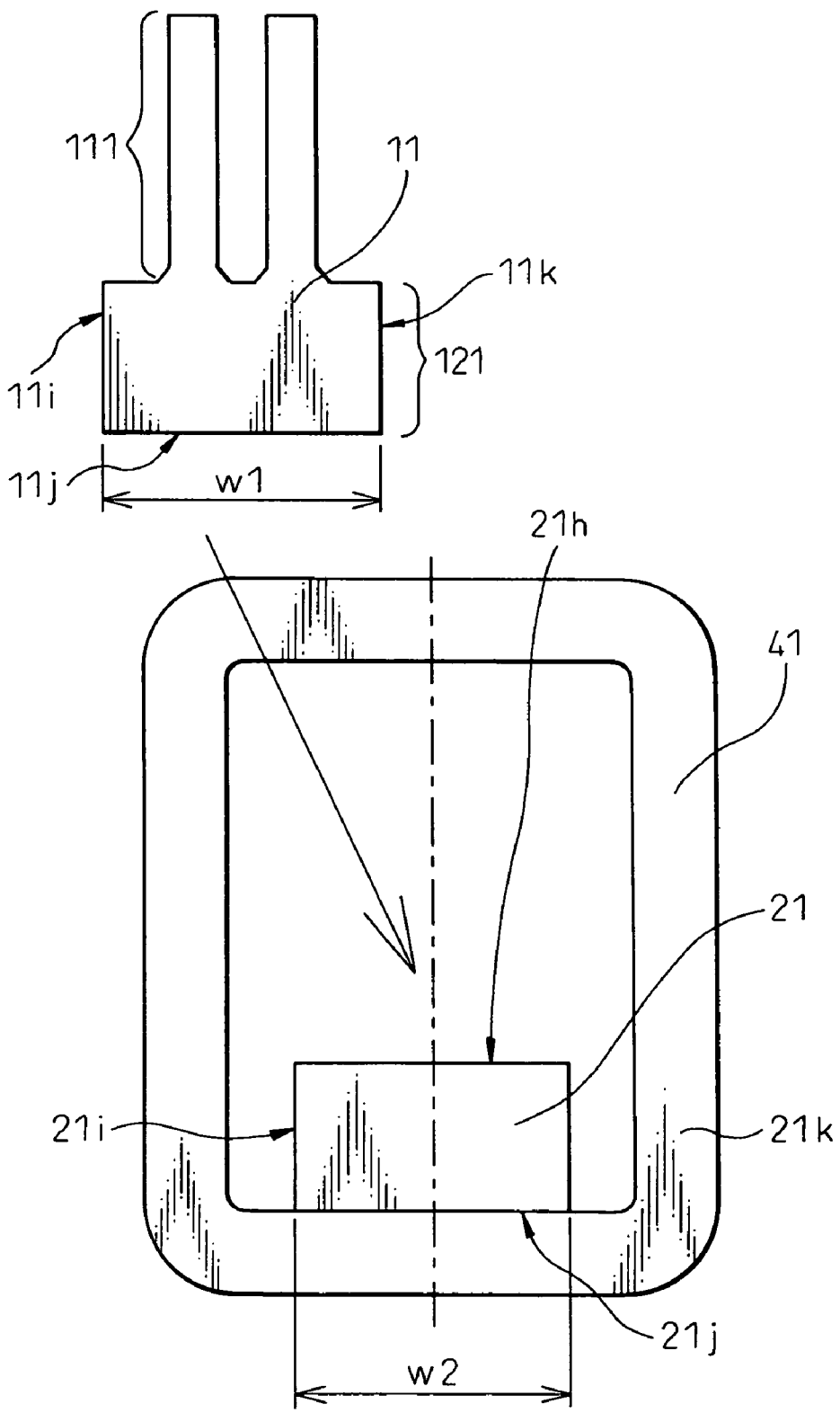

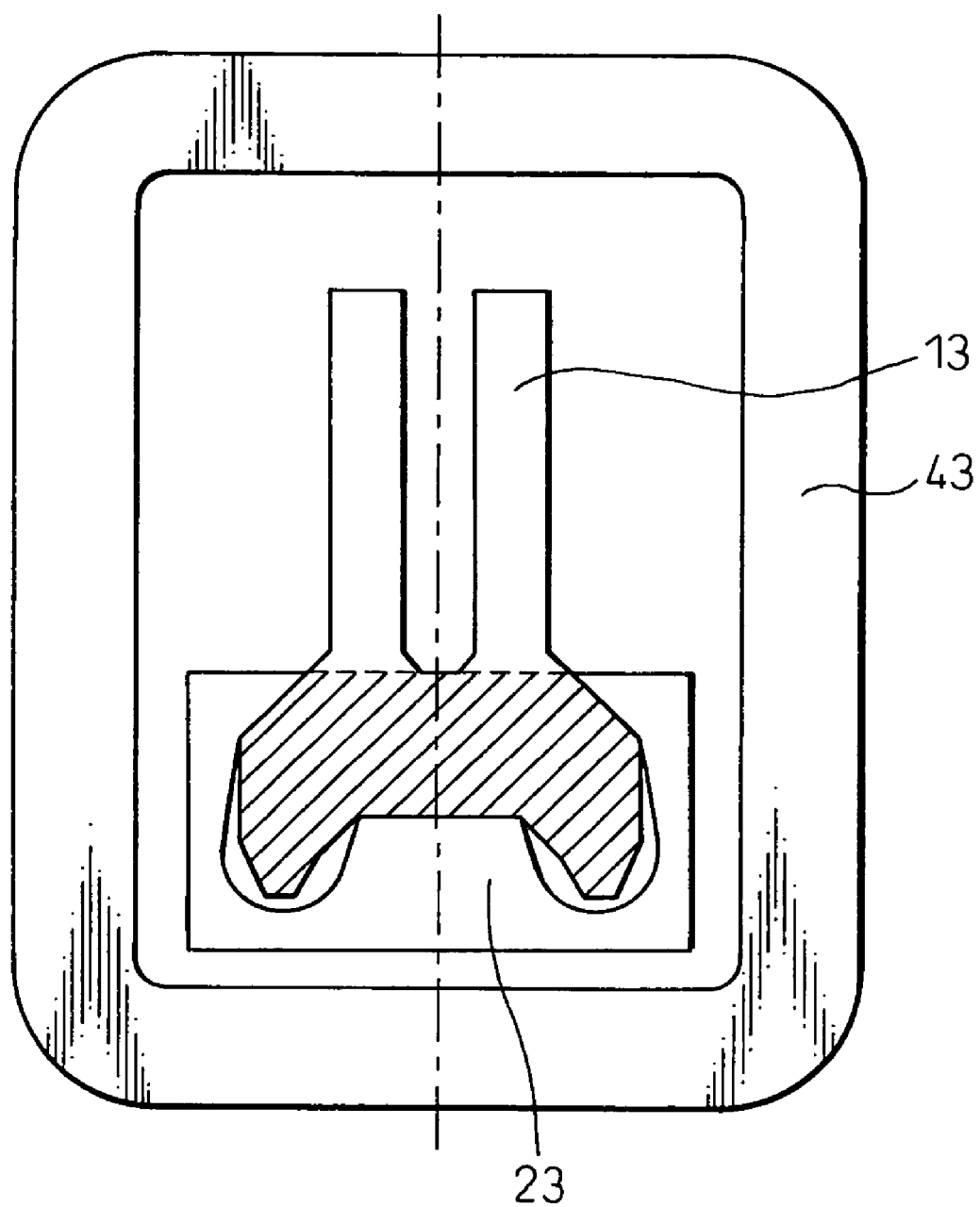

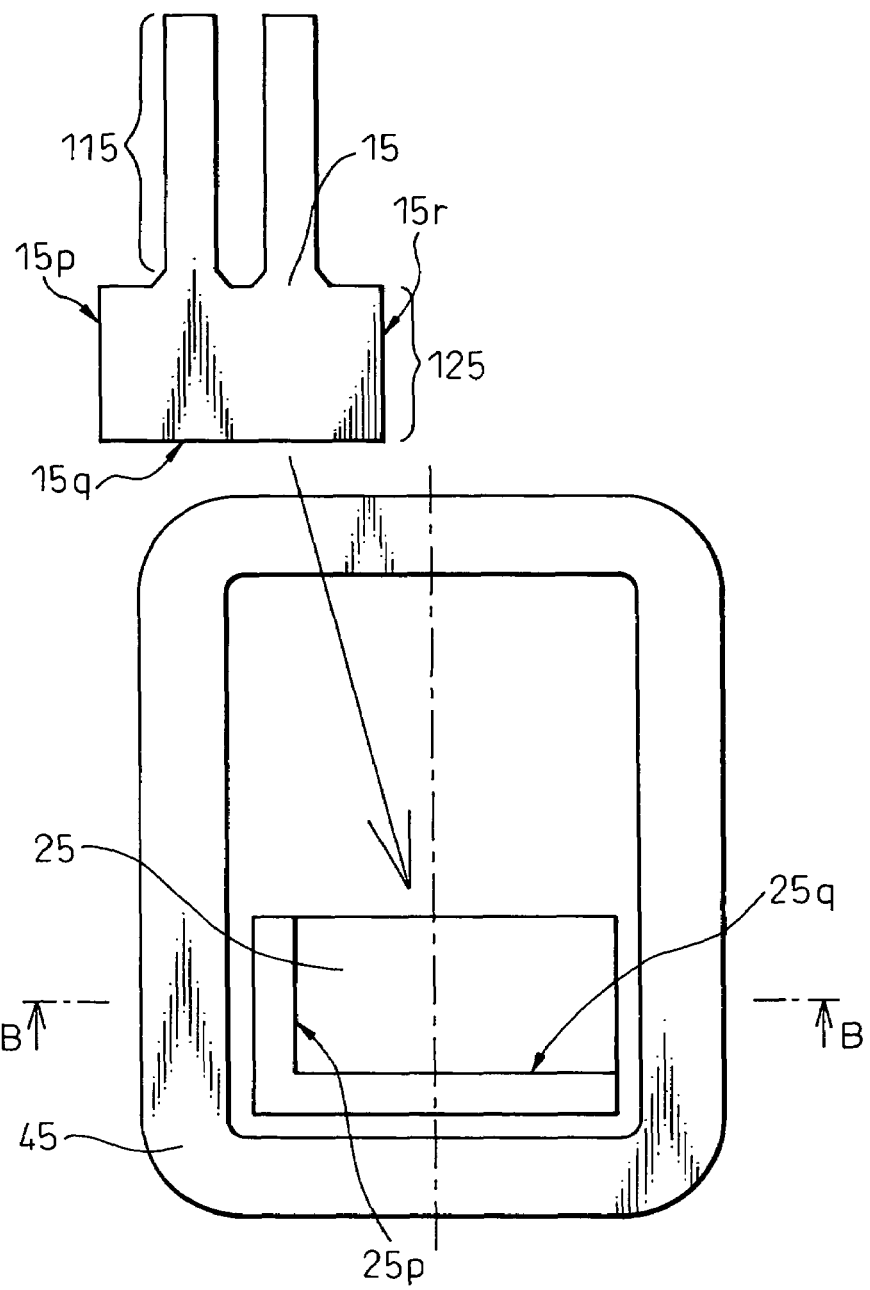
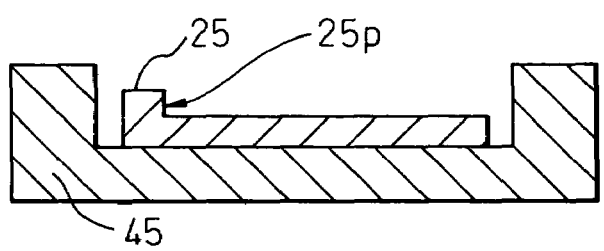

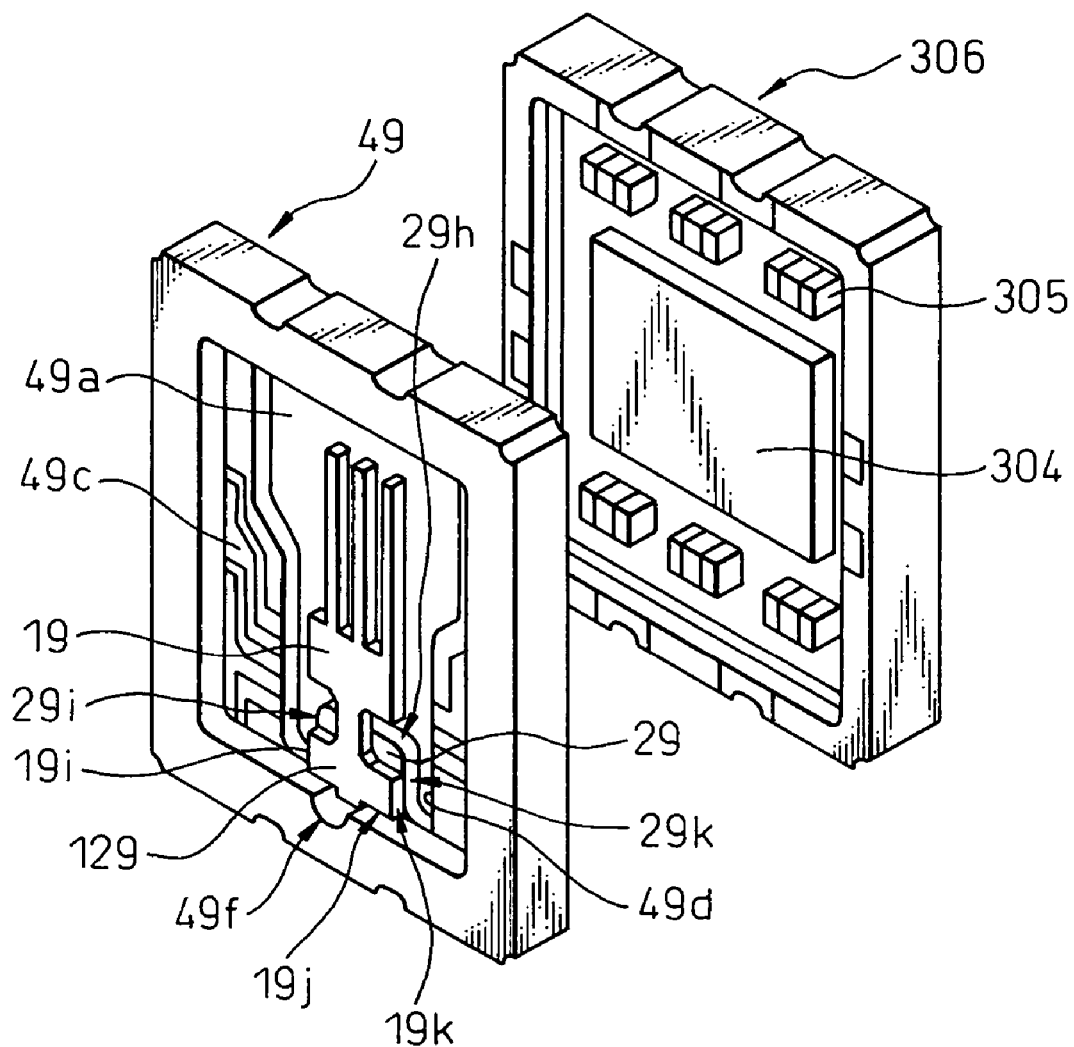

Fig.31A
Fig.31B
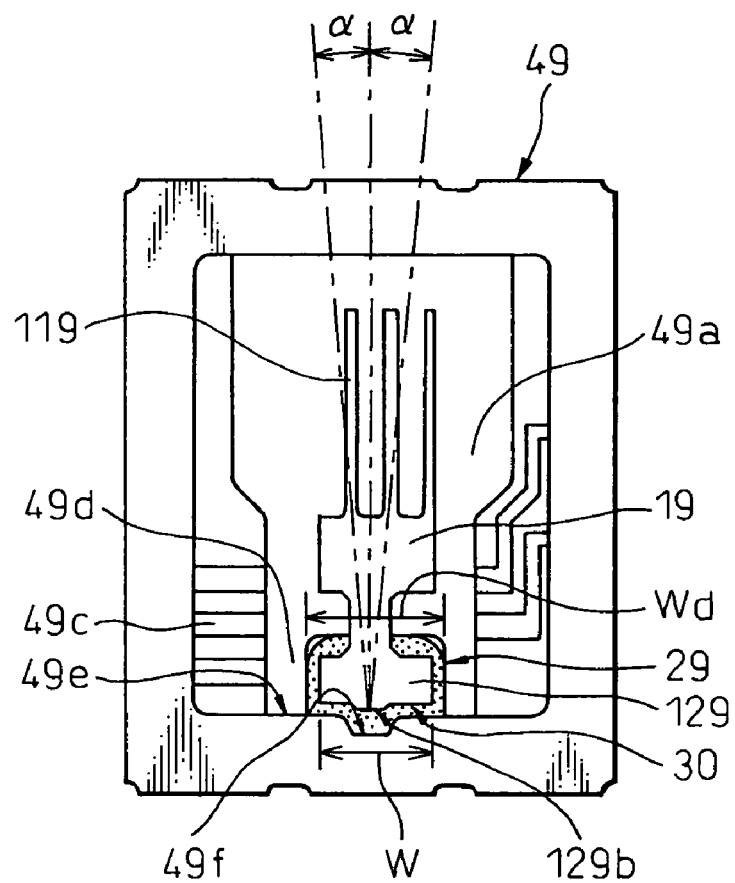
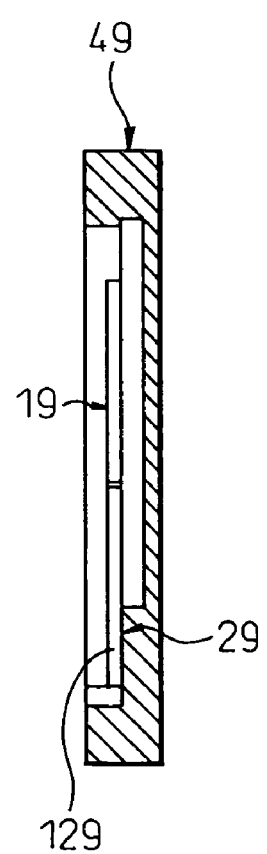

OSCILLATOR DEVICE AND METHOD FOR MANUFACTURING THE DEVICE

FIELD OF THE INVENTION

The present invention relates to a compact oscillator device which uses an oscillator mounted in a package and a method for manufacturing the device.

BACKGROUND OF THE INVENTION

In recent years, vigorous moves toward thin and compact design have been under way in the field of small information apparatuses such as HDDs (Hard Disk Drives), mobile computers, IC cards, and the like, as well as in the field of mobile communication apparatuses such as portable telephones, car telephones, paging systems, and the like. With this trend, the need for reducing the size and thickness of crystal devices, exemplified by crystal oscillators, used in such apparatuses has been increasing.

Among such crystal devices, particularly, in the case of gyro sensor devices used for angular velocity detection in navigation systems or for camera shake control in video cameras, not only the need for a thin and compact design but the need for high accuracy has also been increasing.

With this trend toward thin and compact design and high accuracy, it has become important that a tiny crystal plate, sliced from a crystal substrate, be mounted in a package accurately and under a constant and suitable pressure.

A 32.768-kHz crystal oscillator for a watche, which uses a tuning fork crystal plate, is one known example of such a crystal device (for example, patent document 1: JP-A-2002-9577, page 4 and FIG. 18).

FIG. 33 is a cross-sectional view of an essential portion schematically showing the structure of the above crystal oscillator.

The crystal oscillator 80 has a structure in which the crystal plate 81 sliced in the shape of a tuning fork from a crystal substrate, and provided with metal electrodes (not shown) on its major surfaces for driving purposes, is bonded by an adhesive 84 to a mounting base 83 provided inside a package 85 formed from a ceramic material and is sealed in a vacuum atmosphere by closing the structure with a lid member 86 formed from a transparent glass or ceramic material.

The crystal oscillator 80 is fabricated in the following manner.

First, as shown in FIG. 33, a tiny through-hole communicating between the interior and the exterior of the structure is formed in advance through the package 85.

Then, the base portion of the crystal plate 81 is bonded using the heat-hardenable adhesive 84 to the mounting base 83 provided inside the package 85.

Next, a first sealing step is performed in which the lid member 86 is placed on the package 85 and they are joined together.

Next, a second sealing step is performed. In the second sealing step, a metal sealing material 87 is inserted in the through-hole of the package 85 in a vacuum atmosphere, and a laser beam or an electron beam is applied to the sealing material 87 to heat it using the energy of the laser beam or electron beam. This causes the sealing material 87 to melt and close the through-hole, thus sealing the interior of the package 85 in a vacuum condition.

Other crystal devices, such as crystal oscillators and gyro sensor devices, are also fabricated in substantially the same manner as that described above.

In the fabrication of the above crystal oscillator, the step of bonding the crystal plate 81 to the mounting base 83 provided inside the package 85 has been performed by bonding the crystal plate 81 to the base 83 by the adhesive 84 after suitably positioning the crystal plate 81 on the mounting base 83 which is made somewhat larger than the base portion of the crystal plate 81.

FIG. 34 is a diagram showing examples of bonding failures that can occur in the thus fabricated crystal oscillator.

When the adhesive 84 is hardened by heating, the adhesive 84 undergoes changes in viscosity and changes in stress. At this time, due to the effects of the surface conditions (such as wettability, surface roughness, and contamination) of the mounting base 83, the crystal plate 81 may be pulled unexpectedly in an unintended direction, which can often result in an situation such as shown in FIG. 34A, where the crystal plate 81 is bonded by being displaced from the center axis of the package 85, or in a situation such as shown in FIG. 34B, where the crystal plate 81 is bonded with its vibrating prongs 82 inclined at an angle $\theta$ with respect to the center axis of the package 85.

If the crystal plate 81 is bonded obliquely inside the package 85, in the worst case the crystal plate 81 may come into contact with the package 85. If this happens, vibrations may not be produced as designed, or in some cases, the vibrating prongs 82 may be broken. Since such defects degrade reliability, the prior art crystal oscillator has been designed by making the package somewhat larger in size in order to avoid such defects. As a result, in the prior art, it has been difficult to reduce the size of the package. This problem is not limited to crystal oscillators, but can occur in crystal devices in general.

One application of the crystal device is the gyro sensor device which is used in a navigation system for detecting the position of a vehicle, etc. In the gyro sensor device, the mounting angle of the crystal plate inside the package greatly affects the accuracy of detection of the angular velocity. Usually, in the gyro sensor device, the crystal plate is mounted with its vibrating prongs oriented parallel to the spinning axis Z of the gyro sensor device, and the vibrating prongs are caused to vibrate in directions perpendicular to the spinning axis Z, thereby detecting an accurate angular velocity $\Omega$. However, with the crystal plate bonding method as used in the prior art, it has been difficult to accurately orient the crystal plate with respect to the package, resulting in the problem that a gyro sensor device often has poor accuracy.

It is also known to provide a surface-mount type piezoelectric device that can be mounted directly on the surface of the circuit board of an apparatus (for example, JP-A-2003-152499, page 5 and FIGS. 3 and 4).

FIG. 35 is a cross-sectional view schematically showing the structure of the above piezoelectric device.

The piezoelectric device 90 contains a piezoelectric oscillator 92 inside a package 91. The package 91 is a substrate made, for example, from a sintered aluminum oxide structure formed by sintering a stack of ceramic green sheets, and is formed in the shape of a shallow box. A prescribed interior space S is formed inside the package of the stacked structure. On the bottom of the interior space S, Au- and Ni-plated electrodes 93, spaced a prescribed distance apart from each other, are formed near the edge portion in the width direction of the package 91. The electrodes 93 are connected to an external circuit for supply of a driving voltage.

FIG. 36 shows an enlarged view of the portion where the piezoelectric oscillator 92 is bonded to the electrodes 93 in the piezoelectric device 90.

A silicone-based conductive adhesive 94 is applied on each electrode 93. The base portion of the piezoelectric oscillator 92 is placed on the conductive adhesive 94 and pressed lightly, causing the conductive adhesive 94 to spread. When the conductive adhesive 94 is hardened, the piezoelectric oscillator 92 is bonded to the electrodes 93. When the conductive adhesive 94 is applied and pressed lightly, the spreading conductive adhesive 94 is blocked by a groove 96 formed around each lead electrode 95 of the piezoelectric oscillator 92. Accordingly, the electrodes 93 do not contact each other, thus effectively preventing a short circuit. The open top of the package 91 is closed by bonding a lid member 97 using a brazing flux such as low-melting-point glass. The lid member 97 is formed from an optically transmissive material, for example, glass so that the frequency can be adjusted using laser light passing through the lid member 97.

In a gyro sensor device that uses the above piezoelectric device 90, an AC voltage is applied across the electrodes 95 of the piezoelectric oscillator 92, causing it to vibrate in a driving direction at a velocity v and thus producing vibrations at its natural frequency in the driving direction. In this condition, the tuning fork portion of the piezoelectric oscillator 92 spins at an angular velocity $\omega$ about its center axis extending along the longitudinal direction of the tuning fork portion, and a Coriolis force of $F=2\,mv\omega$ is generated in the piezoelectric oscillator 92. In the gyro sensor device using the above piezoelectric device 90, the angular velocity is detected based on the output voltage generated by the vibrations caused by the Coriolis force. The gyro sensor device is constructed so that the prongs of the tuning fork crystal oscillator are oriented in a prescribed direction relative to the generating direction of the Coriolis force to be detected. Here, if the prongs of the tuning fork crystal oscillator are inclined relative to the generating direction of the Coriolis force, the Coriolis force generated in the prongs is a component of force proportional to the inclination, and the output voltage generated is inaccurate, degrading the detection accuracy. Therefore, in the gyro sensor device, there has been a need to increase the detection accuracy by increasing the mounting accuracy of the tuning fork oscillator.

In the above piezoelectric device 90, when bonding the base portion 92a of the piezoelectric oscillator 92 to the ceramic package 91, there arises the possibility that, due to variations in the amount and position of the applied conductive adhesive 94, the balance of the surface tension of the conductive adhesive 94, between the two electrodes, may be disrupted and the base portion 92a of the piezoelectric oscillator 92 may be bonded obliquely. If the piezoelectric oscillator 92 is not mounted correctly in position, there arises the problem that the performance becomes unstable. Further, in order to increase the mounting accuracy of the piezoelectric oscillator 92, the piezoelectric oscillator 92 must be held in position using a positioning jig or the like until the conductive adhesive 94 hardens. However, the use of such a positioning jig leads to the problem that the work efficiency of the bonding step of the piezoelectric oscillator 92 is degraded.

SUMMARY OF THE INVENTION

It is an object of the present invention to provide a compact and highly reliable oscillator device and a method for manufacturing the same.

It is another object of the present invention to provide a compact and highly reliable and accurate gyro sensor device capable of accurately detecting angular velocity.

An oscillator device according to the present invention includes an oscillator having a vibrating prong and a base portion with a first reference portion, a package, a mounting base with a second reference portion provided inside the package, and a bonding material for fixing the oscillator to the mounting base by aligning the first reference portion with the second reference portion by utilizing a self-alignment effect occurring due to surface tension.

Preferably, in the oscillator device according to the present invention, the first reference portion has three straight line portions defining an outer shape of the base portion, and the second reference portion has three straight line portions corresponding in position to the three straight line portions that constitute the first reference portion.

Preferably, in the oscillator device according to the present invention, one of the three straight line portions constituting the second reference portion is a contact line between an inside wall of the package and the mounting base.

Preferably, in the oscillator device according to the present invention, the first reference portion has two side wall faces defining an outer shape of the oscillator, and the second reference portion has two bonding faces corresponding to the two side wall faces.

Preferably, in the oscillator device according to the present invention, the mounting base is formed from a group of a plurality of projections.

Preferably, in the oscillator device according to the present invention, the first reference portion has a plurality of sets of three straight line portions defining an outer shape of the base portion, and the second reference portion has a plurality of sets of three straight line portions corresponding in position to the three straight line portions in each of the plurality of sets constituting the first reference portion.

Preferably, in the oscillator device according to the present invention, the first reference portion has three straight line portions defining an outer shape of the oscillator, the second reference portion has two straight line portions corresponding in position to at least two of the straight line portions constituting the first reference portion, and an inside wall of the package has a bonding face corresponding to at least one of the straight line portions constituting the first reference portion.

Preferably, in the oscillator device according to the present invention, a recess is formed in the bonding face or in the inside wall of the package.

Preferably, in the oscillator device according to the present invention, the width (W) of the base portion and the width (Wd) of the mounting base satisfy the relation 0.86 W<Wd<1.16 W, and preferably, the width of the base portion is substantially equal to the width of the mounting base.

Preferably, in the oscillator device according to the present invention, the package has a recess and the mounting base is provided inside the recess.

Preferably, the oscillator device according to the present invention further comprises a wiring portion, provided inside the recess and connected to the oscillator, and a groove, formed between the wiring portion and the mounting base, for storing a spillover of the bonding material.

Preferably, in the oscillator device according to the present invention, the package is a ceramic package.

Preferably, in the oscillator device according to the present invention, the first reference portion has a plurality of grooves formed in parallel and extending in a first direction, and the second reference portion has a plurality of grooves formed in parallel and extending substantially in the first direction.

Preferably, in the oscillator device according to the present invention, the number of grooves formed in the first reference portion is equal to the number of grooves formed in the second reference portion.

A method for manufacturing an oscillator device according to the present invention includes the steps of forming an oscillator having a vibrating prong and a base portion with a first reference portion, forming a package having a mounting base with a second reference portion, placing the oscillator on the mounting base by aligning the first reference portion with the second reference portion by utilizing a self-alignment effect occurring due to surface tension of a bonding material, and hardening the bonding material.

Preferably, in the method for manufacturing an oscillator device according to the present invention, the first reference portion is formed so as to have three straight line portions defining an outer shape of the base portion, and the second reference portion is formed so as to have three straight line portions corresponding in position to the three straight line portions that constitute the first reference portion.

Preferably, in the method for manufacturing an oscillator device according to the present invention, one of the three straight line portions constituting the second reference portion is a contact line between an inside wall of the package and the mounting base.

Preferably, in the method for manufacturing an oscillator device according to the present invention, the first reference portion is formed so as to have two side wall faces defining an outer shape of the oscillator, and the second reference portion is formed so as to have two bonding faces corresponding to the two side wall faces.

Preferably, in the method for manufacturing an oscillator device according to the present invention, the mounting base is formed from a group of a plurality of projections.

Preferably, in the method for manufacturing an oscillator device according to the present invention, the first reference portion is formed so as to have a plurality of sets of three straight line portions defining an outer shape of the base portion, and the second reference portion is formed so as to have a plurality of sets of three straight line portions corresponding in position to the three straight line portions in each of the plurality of sets constituting the first reference portion.

Preferably, in the method for manufacturing an oscillator device according to the present invention, the oscillator is formed by etching.

Preferably, in the method for manufacturing an oscillator device according to the present invention, the mounting base is formed integrally with the package.

Preferably, in the method for manufacturing an oscillator device according to the present invention, the first reference portion is formed so as to have three straight line portions defining an outer shape of the oscillator, the second reference portion is formed so as to have two straight line portions corresponding in position to at least two of the straight line portions constituting the first reference portion, and an inside wall of the package is formed so as to have a bonding face corresponding to at least one of the straight line portions constituting the first reference portion.

Preferably, in the method for manufacturing an oscillator device according to the present invention, the bonding face or the inside wall of the package is formed so as to have a recess.

Preferably, in the method for manufacturing an oscillator device according to the present invention, the width (W) of the base portion and the width (Wd) of the mounting base satisfy the relation $0.86\,W < Wd < 1.16\,W$, and preferably, the base portion is formed so as to have a width substantially equal to the width of the mounting base.

Preferably, in the method for manufacturing an oscillator device according to the present invention, the package is formed to have a recess, and the mounting base is formed inside the recess.

Preferably, in the method for manufacturing an oscillator device according to the present invention, the package is formed so as to have a wiring portion inside the recess for connecting to the crystal plate and also to have a groove, formed between the wiring portion and the mounting base, for storing a spillover of the bonding material.

Preferably, in the method for manufacturing an oscillator device according to the present invention, the package is a ceramic package.

Preferably, in the method for manufacturing an oscillator device according to the present invention, the first reference portion is formed so as to have a plurality of grooves formed in parallel and extending in a first direction, and the second reference portion is formed so as to have a plurality of grooves formed in parallel and extending substantially in the first direction.

Preferably, in the method for manufacturing an oscillator device according to the present invention, the number of grooves formed in the first reference portion is equal to the number of grooves formed in the second reference portion.

Preferably, in the oscillator device and the method for manufacturing the oscillator device according to the present invention, the oscillator is a crystal plate.

The present invention also provides a crystal device in which a crystal plate having a base portion and a plurality of vibrating prongs formed protruding from the base portion is mounted within a package, wherein the base portion of the crystal plate has an outline formed by at least three straight line portions, and the package is provided with a mounting base having a face to which the crystal plate is to be bonded and whose outline has three straight line portions corresponding in position to three straight line portions arbitrarily selected from among the straight line portions forming the outline of the base portion of the crystal plate, and wherein the crystal plate is bonded to the mounting base with the three straight line portions of the outline of the base portion of the crystal plate aligned with the three straight line portions of the outline of the face of the mounting base to which the crystal plate is bonded.

The present invention further provides a crystal device in which a crystal plate having a base portion and a plurality of vibrating prongs formed protruding from the base portion is mounted within a package, wherein the base portion of the crystal plate has at least two side wall faces, and the package is provided with a mounting base having a face to which the crystal plate is to be bonded and along the periphery of which are formed two wall faces corresponding in position to two side wall faces arbitrarily selected from the side wall faces formed on the base portion of the crystal plate, and wherein the two side wall faces formed on the base portion of the crystal plate are bonded face-to-face to the two wall faces formed along the periphery of the face of the mounting base to which the crystal plate is bonded.

The present invention further provides a method for manufacturing a crystal device in which a crystal plate having a base portion and a plurality of vibrating prongs formed protruding from the base portion is mounted within a package, wherein the method includes the steps of forming the crystal plate having the base portion whose outline has at least three straight line portions, forming the package provided with a mounting base having a bonding face to which the crystal plate is to be bonded and whose outline has three straight line portions corresponding in position to three straight line portions arbitrarily selected from among the straight line portions forming the outline of the base portion of the crystal plate, placing the base portion of the crystal plate on the bonding face of the mounting base by interposing an adhesive therebetween, and hardening the adhesive.

The present invention also provides a crystal gyro in which a crystal plate having a base portion and a plurality of vibrating prongs formed protruding from the base portion is mounted within a package, wherein the base portion of the crystal plate has a plan shape defined by at least three straight line portions, and the package is provided with a mounting base having a face to which the base portion of the crystal plate is to be bonded and whose shape is defined by a plurality of straight line portions which include two or more sets of three straight line portions corresponding in position to three straight line portions arbitrarily selected from among the straight line portions defining the plan shape of the base portion of the crystal plate, and wherein the crystal plate is bonded to the mounting base with the three straight line portions of the plan shape of the base portion of the crystal plate aligned with three straight line portions arbitrarily selected from among the straight line portions of the face of the mounting base to which the crystal plate is bonded.

The present invention further provides a method for manufacturing a crystal gyro in which a crystal plate having a base portion and a plurality of vibrating prongs formed protruding from the base portion is mounted within a package, wherein the method includes the steps of forming the crystal plate having the base portion whose outline has at least three straight line portions; forming the package provided with a mounting base having a bonding face to which the crystal plate is to be bonded and whose outline has two or more sets of three straight line portions corresponding in position to three straight line portions arbitrarily selected from among the straight line portions forming the outline of the base portion of the crystal plate, aligning the three straight line portions of the plan shape of the base portion of the crystal plate with three straight line portions arbitrarily selected from among the straight line portions of the face of the mounting base to which the crystal plate is to be bonded, placing the base portion of the crystal plate on the bonding face of the mounting base by interposing an adhesive therebetween, and hardening the adhesive.

The present invention also provides a crystal device in which a crystal plate having a base portion and a plurality of vibrating prongs formed protruding from the base portion is mounted within a package, wherein a plurality of parallel grooves extending in a prescribed direction are formed in the base portion of the crystal device, and the package is provided with a mounting base to which the crystal plate is to be bonded and in which are formed a plurality of parallel grooves extending in a prescribed direction, and wherein the grooves formed in the base portion of the crystal device and the grooves formed in the mounting base are arranged along substantially the same direction.

The present invention further provides a method for manufacturing a crystal device in which a crystal plate having a base portion and a plurality of vibrating prongs formed protruding from the base portion is fixed to a mounting base provided inside a package, wherein the method includes the steps of forming a plurality of grooves in the base portion of the crystal plate by etching, forming a plurality of grooves in the mounting base provided inside the package; sandwiching an adhesive between the grooved base portion of the crystal plate and the grooved mounting base by placing the base portion of the crystal plate with the grooves formed therein oriented in substantially the same direction as the grooves formed in the mounting base, and hardening the adhesive and thereby bonding the base portion of the crystal plate to the mounting base.

The present invention also provides a crystal gyro in which a crystal plate having a base portion and a plurality of vibrating prongs formed protruding from the base portion is mounted within a package, wherein a plurality of parallel grooves extending along the longitudinal direction of the vibrating prongs are formed in the base portion of the crystal device, and the package is provided with a mounting base to which the crystal plate is to be bonded and in which are formed a plurality of parallel grooves extending along a spinning axis whose angular velocity is to be detected, and wherein the grooves formed in the base portion of the crystal device and the grooves formed in the mounting base are arranged along substantially the same direction.

The present invention further provides a method for manufacturing a crystal gyro in which a crystal plate having a base portion and a plurality of vibrating prongs formed protruding from the base portion is fixed to a mounting base provided inside a package, wherein the method includes the steps of forming a plurality of grooves in the base portion of the crystal plate by etching, forming a plurality of grooves in the mounting base provided inside the package, sandwiching an adhesive between the grooved base portion of the crystal plate and the grooved mounting base by placing the base portion of the crystal plate with the grooves formed therein oriented in substantially the same direction as the grooves formed in the mounting base, and hardening the adhesive and thereby bonding the base portion of the crystal plate to the mounting base.

The present invention also provides an oscillator device in which a piezoelectric oscillator having a vibrating portion and a base portion is fixed to a supporting substrate by an adhesive, wherein the supporting substrate has a mounting base for mounting the base portion thereon, and the width of the mounting base is substantially equal to the width of the base portion.

In the oscillator device or the method for manufacturing the oscillator device according to the present invention, the base portion of the crystal plate has at least three straight line portions defining the outer shape of the base portion, while the bonding face of the mounting base to which the oscillator is to be bonded has an outer shape defined by three straight line portions corresponding in position to the three straight line portions of the base portion of the oscillator. By performing the positioning while recognizing the positions of the three straight line portions of the base portion of the oscillator and the positions of the three straight line portions of the bonding face of the mounting base, the oscillator can be positioned on the mounting base accurately in a prescribed position and at a prescribed angle.

When the three straight line portions of the base portion of the oscillator and the three straight line portions of the bonding face of the mounting base are formed at mutually corresponding positions, the outer shape of the base portion of the oscillator and the outer shape of the bonding face of the mounting base are substantially identical to each other.

When the oscillator and the mounting base have the relationship as defined in the oscillator device according to the present invention, if the oscillator is placed out of position relative to the mounting base by interposing an adhesive therebetween, the surface tension of the adhesive acts to exert a force so as to minimize the surface area of the adhesive before the adhesive hardens, the force working to bring the oscillator into alignment with the mounting base. In this case, if the outer shape of the base portion of the oscillator and the outer shape of the bonding face of the mounting base are exactly identical to each other, the base portion of the oscillator can be accurately aligned with the mounting base and can thus be positioned with the highest accuracy.

That is, making the outer shape of the base portion of the oscillator and the outer shape of the bonding face of the mounting base substantially identical to each other offers the effect of reducing placement errors between the crystal plate and the package provided with the mounting base.

Further, in the oscillator device or the method for manufacturing the oscillator device according to the present invention, fine grooves extending in parallel to the longitudinal direction of the vibrating prong are formed in the base portion of the oscillator, and similarly, fine grooves are also formed in the mounting base. The base portion of the oscillator is placed on the mounting base with their grooves oriented in the same direction, and an adhesive is injected into the grooves. As the adhesive is in a liquid state, capillary forces occur in the adhesive in the grooves and, with these capillary forces, the oscillator is pulled so that the grooves formed in the oscillator orient in parallel to the grooves formed in the mounting base. As the grooves in the oscillator are formed in parallel to the longitudinal direction of the vibrating prong, the fact that the grooves formed in the oscillator orient in parallel to the grooves formed in the mounting base means that the vibrating prong orients in parallel to the direction of the grooves formed in the mounting base. In this way, the oscillator can be fixed in the correct orientation without inclining with respect to the package.

The above fine grooves can be formed with micron-level accuracy by etching. Therefore, by using the grooves formed by etching, the positioning accuracy of the oscillator can be further enhanced.

According to the oscillator device and the method for manufacturing the oscillator device described in the present invention, as the oscillator can be accurately positioned and bonded in the prescribed position, the problem of the oscillator coming into contact with the package can be eliminated, achieving stable vibration characteristics. As a result, a highly reliable oscillator device can be obtained.

Further, according to the oscillator device and the method for manufacturing the oscillator device described in the present invention, as the oscillator does not easily contact the package even if the size of the package is reduced, the overall size of the oscillator device can be reduced.

Furthermore, according to the oscillator device and the method for manufacturing the oscillator device described in the present invention, a gyro sensor device capable of detecting angular velocity stably with high accuracy can be provided by using the oscillator device of the present invention.

Furthermore, according to the oscillator device and the method for manufacturing the oscillator device described in the present invention, a gyro sensor device of optimum configuration that matches the use of the navigation system can be easily provided by using the oscillator device of the present invention.

Further, in the oscillator device according to the present invention, as the width of the base portion, as the bonding portion of the oscillator, is made substantially equal to the width of the mounting base as the bonding portion of the package, and the base portion of the oscillator is bonded to the mounting base of the package by an adhesive, the self-alignment function of the adhesive can be utilized. Accordingly, the inclining of the oscillator (piezoelectric oscillator) can be held within a desired tolerance range of, for example, within ±5°. That is, when the oscillator device according to the present invention is used, the detection accuracy of the gyro sensor device can be increased. Further, when a notch (recess) is formed in a portion of the inside wall of the package where the edge of the base portion of the oscillator contacts, and a burr remaining on a side face of the base portion of the oscillator is allowed to enter the recess, the burr can be prevented from coming into contact with the side wall, and an oscillator device having stable performance and relatively free from manufacturing variations can be provided.

BRIEF DESCRIPTION OF THE DRAWINGS

FIG. 2 is a diagram showing the condition in which the crystal plate is bonded to a mounting base in the crystal device according to the first embodiment.

FIGS. 3A, 3B, and 3C are diagrams showing a method for manufacturing the crystal device according to the first embodiment.

FIG. 4 is a plan view showing the mounting position of a crystal plate in a crystal device according to a second embodiment.

FIG. 9 is a diagram showing the condition in which the crystal plate is bonded to a mounting base in the crystal device according to the fourth embodiment.

FIG. 12A is a plan view showing the mounting position of a crystal plate in a crystal device according to a sixth embodiment, and FIG. 12B is a cross-sectional view of the structure shown in FIG. 12A.

FIG. 30 is a perspective view showing the condition before a supporting substrate mounted with a piezoelectric oscillator shown in FIG. 28 is installed.

FIG. 31A is a plan view showing the condition in which the piezoelectric oscillator is bonded to the mounting base of the supporting substrate shown in FIG. 28, and FIG. 31B is a cross-sectional view thereof.

DETAILED DESCRIPTION OF THE PREFERRED EMBODIMENT

An oscillator device and a method of manufacture thereof according to the present invention, and a gyro sensor device and a method of manufacture thereof according to the present invention, will be described below with reference to the drawings.

A primary feature of the present invention is that the oscillator is accurately bonded to a prescribed position on the mounting base of the package by using a first reference provided on the oscillator, a second reference provided on the mounting base, and the self-alignment effect of the bonding material used for bonding. Structures for carrying out the present invention having the above feature and specific effects achieved by the structures will be described with reference to the embodiments hereinafter given. It will, however, be understood that the embodiments to be described herein are only illustrative, and the present invention is not limited to these embodiments.

First Embodiment

Figure 1:
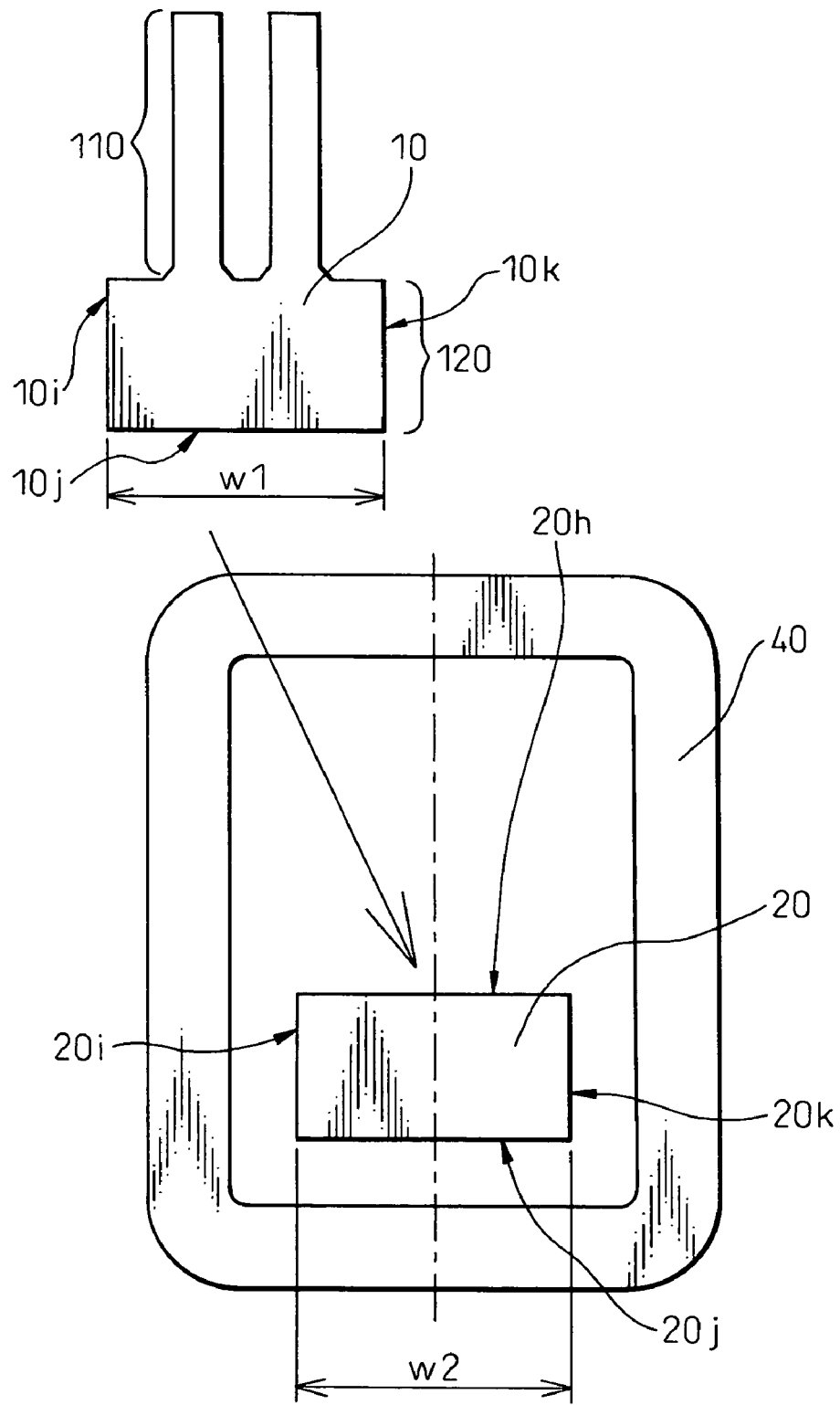
FIG. 1 is a plan view showing the mounting position of a crystal plate in a crystal device according to a first embodiment.

FIG. 1 is a plan view showing the mounting position of a crystal plate and a package provided with a mounting base having a rectangular bonding face in a crystal device according to the present invention.

The crystal plate 10 used in the crystal device according to the first embodiment comprises a base portion 120 and a plurality of vibrating prongs 110 protruding from the base portion 120. On the other hand, the mounting base 20 is provided inside the package 40 in which the crystal plate 10 is mounted, and the base portion 120 of the crystal plate 10 is bonded to the mounting base 20 by an adhesive or the like.

As shown in FIG. 1, the base portion 120 of the crystal plate 10 has a plan shape formed by an outline having three straight line portions 10$i$, 10$j$, and 10$k$. The straight line portions 10$i$ and 10$k$ are parallel to each other with a uniform spacing w1, while the straight line portion 10$j$ is perpendicular to the straight line portions 10$i$ and 10$k$.

On the other hand, the upper face of the mounting base 20, i.e., the face to which the base portion 120 of the crystal plate 10 is to be bonded, has a rectangular plan shape formed by an outline having four straight line portions 20$h$, 20$i$, 20$j$, and 20$k$. The straight line portions 20$i$ and 20$k$ are parallel to each other with a uniform spacing w2, while the straight line portions 20$h$ and 20$j$ are perpendicular to the straight line portions 20$i$ and 20$k$.

FIG. 2 is a diagram showing the condition in which the crystal plate 10 shown in FIG. 1 is bonded to the mounting base 20.

In FIG. 2, the area shown by oblique hatching indicates the portion where the crystal plate 10 is bonded to the mounting base 20 by an adhesive. As can be seen from the bonding condition shown in FIG. 2 and the shapes of the crystal plate 10 and mounting base 20 shown in FIG. 1, in the crystal device according to the present invention, the crystal plate 10 is bonded to the mounting base 20 with the straight outline portion 10$i$ of the base portion 120 of the crystal plate 10 aligned with the straight outline portion 20$i$ of the bonding face of the mounting base 20, the straight outline portion 10$j$ of the base portion 120 of the crystal plate 10 aligned with the straight outline portion 20$j$ of the bonding face of the mounting base 20, and the straight outline portion 10$k$ of the base portion 120 of the crystal plate 10 aligned with the straight outline portion 20$k$ of the bonding face of the mounting base 20.

That is, the spacing w1 between the straight line portions 10$i$ and 10$k$ is made substantially the same as the spacing w2 between the straight line portions 20$i$ and 20$k$. Further, the three straight line portions 10$i$, 10$j$, and 10$k$ (first reference) of the base portion 120 of the crystal plate 10 are arranged in positions substantially corresponding to the three straight line portions 20$i$, 20$j$, and 20$k$ (second reference) of the mounting base 20.

The above structure can be achieved by the manufacturing method described below and the effect associated with it; with the above structure, the crystal plate 10 can be bonded to the mounting base 20 inside the package 40 without causing a positional displacement.

FIG. 3 is a diagram showing the manufacturing method for the crystal device shown in FIGS. 1 and 2. A cross section taken along line D-D in FIG. 2 is shown in FIG. 3.

First, the crystal plate 10 having a base portion of a prescribed size and the package 40 provided with the mounting base 20 of a prescribed size are formed separately. In the present embodiment, the crystal plate 10 is formed by etching a crystal substrate. As a desired pattern can be formed with micron-level accuracy by etching, the crystal plate 10 can be formed with extremely accurate outer dimensions. The package 40 and the mounting base 20 provided therein are integrally formed using a conventional ceramic fabrication method in which green sheets are formed and sintered to fabricate a desired structure. By integrally forming the package 40 and the mounting base 20 provided therein, the package 40 can be formed with the mounting base 20 accurately placed in the desired position.

Next, as shown in FIG. 3A, an adhesive 30 is applied in a suitable amount using a dispenser or the like onto the upper face of the thus formed mounting base 20, i.e., the face to which the base portion of the crystal plate 10 is to be bonded. Next, the crystal plate 10 is placed on the mounting base 20 with the adhesive 30 therebetween. At this time, the three straight line portions 10$i$, 10$j$, and 10$k$ of the base portion 120 of the crystal plate 10 are aligned with the three straight line portions 20$i$, 20$j$, and 20$k$ of the mounting base 20 by recognizing their positions visually or through image processing using a suitable optical device, thereby accomplishing the positioning while reducing the amount of displacement compared with the prior art.

Here, if the crystal plate 10 is placed out of position relative to the mounting base 20, as shown in FIG. 3B, the surface tension of the adhesive 30 acts to exert a force (a force indicated by an arrow in the figure) so as to minimize the surface area s1 of the adhesive 30. That is, the force works to bring the crystal plate 10 into alignment with the mounting base 20, automatically correcting the positional displacement. In this way, the crystal plate 10 is accurately positioned relative to the mounting base 20, with the three straight line portions 10$i$, 10$j$, and 10$k$ of the base portion 120 of the crystal plate 10 shown in FIG. 1 aligned with the three straight line portions 20$i$, 20$j$, and 20K of the mounting base 20.

The positioning is completed when the surface area of the adhesive 30 is reduced to a minimum (s2). Thereafter, the adhesive 30 is hardened to accomplish the bonding of the crystal plate 10 to the package 40 in the crystal device according to the present invention. In the present embodiment, the adhesive is hardened by heating because the adhesive 30 is a heat-hardenable adhesive, but use may be made of other kinds of bonding material such as a UV-hardenable adhesive, a two-component mixed type hardenable adhesive, solder, etc. The technique for performing alignment by automatically correcting for placement errors, as described above, is called self-alignment. That is, any kind of adhesive or bonding material, including solder, can be used in the present embodiment as long as the material is of the type that does not instantly solidify but can allow for self-alignment. The same applies to the other embodiments described herein.

As described above, according to the crystal device manufacturing method of the first embodiment, the positioning can be performed while recognizing the positions of the three straight line portions 10$i$, 10$j$, and 10$k$ (first reference) of the base portion 120 of the crystal plate 10 and the positions of the three straight line portions 20$i$, 20$j$, and 20$k$ (second reference) of the mounting base 20. Further, according to the crystal device manufacturing method of the first embodiment, and as the crystal plate 10 can be accurately positioned using the first reference, the second reference, and the self-alignment effect of the adhesive 30, the positioning accuracy is greatly increased compared with any prior known method. As a result, defects relating to the vibration characteristics and defects such as breakage of the vibrating prongs of the crystal plate 10, which occurred in the prior art, have been substantially eliminated, and the reliability of the crystal device has increased.

Furthermore, as the possibility of the crystal plate 10 being bonded obliquely and coming into contact with the package 40 has been reduced, it has become possible to reduce the package 40 to the smallest possible size and just sufficient to accommodate the crystal plate 10. As a result, a crystal device smaller than the prior art can be provided.

The positioning accuracy between the crystal plate 10 and the mounting base 20 that can be provided by the above self-alignment becomes highest when the outer dimensions of the base portion of the crystal plate 10 are exactly the same as those of the bonding face of the mounting base 20.

However, according to the inventor's experiment, it has been found that, if the outer dimensions of the base portion of the crystal plate 10 are not exactly the same as those of the bonding face of the mounting base 20, no particular problem occurs in the usual manufacturing process of the crystal device as long as the outer dimensions match within a certain range of tolerance. According to the experiment, it has also been verified that no problem occurs as long as the spacing w1 between the straight line portions 10$i$ and 10$k$ of the base portion 120 of the crystal plate 10 and the spacing w2 between the straight line portions 20$i$ and 20$k$ of the bonding face of the mounting base 20 satisfy the relation $0.86w1 < w2 < 1.16w1$.

Second Embodiment

FIG. 4 is a plan view showing the mounting position of a crystal plate and a package provided with a mounting base having a rectangular bonding face in a crystal device according to the present invention.

The crystal plate 11 used in the crystal device according to the second embodiment comprises a base portion 121 and a plurality of vibrating prongs 111 protruding from the base portion 121. On the other hand, the mounting base 21 is provided inside the package 41 in which the crystal plate 11 is mounted, and the base portion 121 of the crystal plate 11 is bonded to the mounting base 21 by an adhesive or the like.

As shown in FIG. 4, the base portion 121 of the crystal plate 11 has a plan shape formed by an outline having three straight line portions 11$i$, 11$j$, and 11$k$. The straight line portions 11$i$ and 11$k$ are parallel to each other with a uniform spacing w1, while the straight line portion 11$j$ is perpendicular to the straight line portions 11$i$ and 11$k$.

On the other hand, the upper face of the mounting base 21, i.e., the face to which the base portion 121 of the crystal plate 11 is to be bonded, has a rectangular plan shape formed by an outline having four straight line portions 21$h$, 21$i$, 21$j$, and 21$k$. The straight line portions 21$i$ and 21$k$ are parallel to each other with a uniform spacing w2, while the straight line portions 21$h$ and 21$j$ are perpendicular to the straight line portions 21$i$ and 21$k$.

Further, the mounting base 21 is formed so as to contact the inside wall of the box-like package 41, as shown in FIG. 4. Therefore, one of the four straight outline portions of the bonding face of the mounting base 21, i.e., the straight line portion 21$j$, is formed as a contact line defining the boundary between the package 41 and the mounting base 21.

Figure 5:
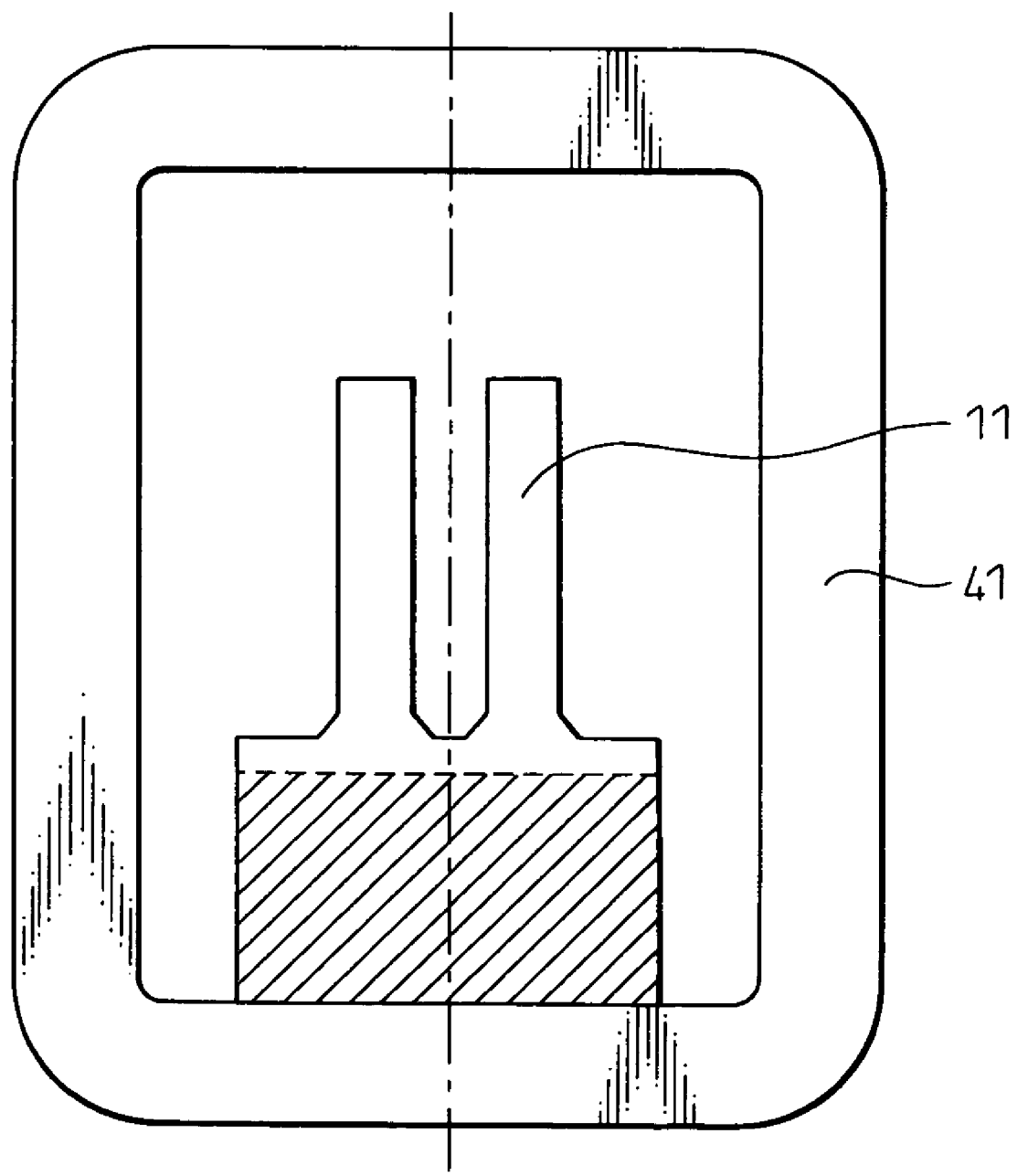
FIG. 5 is a diagram showing the condition in which the crystal plate is bonded to a mounting base in the crystal device according to the second embodiment.

FIG. 5 is a diagram showing the condition in which the crystal plate 11 shown in FIG. 4 is bonded to the mounting base 21.

In FIG. 5, the area shown by oblique hatching indicates the portion where the crystal plate 11 is bonded to the mounting base 21 by an adhesive. As can be seen from the bonding condition shown in FIG. 5 and the shapes of the crystal plate 11 and mounting base 21 shown in FIG. 4, in the crystal device according to the present invention, the crystal plate 11 is bonded to the mounting base 21 with the straight outline portion 11i of the base portion 121 of the crystal plate 11 aligned with the straight outline portion 21i of the bonding face of the mounting base 21, the straight outline portion 11j of the base portion 121 of the crystal plate 11 aligned with the straight outline portion 21j of the bonding face of the mounting base 21 (or with the inside wall of the package 41), and the straight outline portion 11k of the base portion 121 of the crystal plate 11 aligned with the straight outline portion 21k of the bonding face of the mounting base 21.

That is, the spacing w1 between the straight line portions 11i and 11k is made substantially the same as the spacing w2 between the straight line portions 21i and 21k. Further, the two straight line portions 11i and 11k of the base portion 121 of the crystal plate 11 are arranged in positions substantially corresponding to the two straight line portions 21i and 21k of the mounting base 21. The base portion 121 of the crystal plate 11 is bonded with its straight line portion 11j facing the straight line portion 21j (the contact line between the package 41 and the mounting base 21).

In the above structure also, positioning relatively free from placement errors can be accomplished by performing the positioning while recognizing the positions of the three straight line portions 11i, 11j, and 11k (first reference) of the base portion 121 of the crystal plate 11 and the positions of the three straight line portions 21i, 21j (the contact line between the package 41 and the mounting base 21), and 21k (second reference) of the mounting base 20. Further, using the first reference, the second reference, and the self-alignment effect of the adhesive, the two straight line portions 11i and 11k of the base portion 121 of the crystal plate 11 are accurately aligned with the two straight line portions 21i and 21k of the mounting base 21, as shown in FIG. 3, and accurate positioning is accomplished with the straight line portion 11j of the base portion 121 of the crystal plate 11 and the straight line portion 21j (the contact line between the package 41 and the mounting base 21) being pulled as will be described later with reference to FIG. 13B. Accordingly, the positioning accuracy can be greatly increased compared with any prior known method. As a result, the reliability of the crystal device can be enhanced, while its size can be reduced.

Third Embodiment

Figure 6:
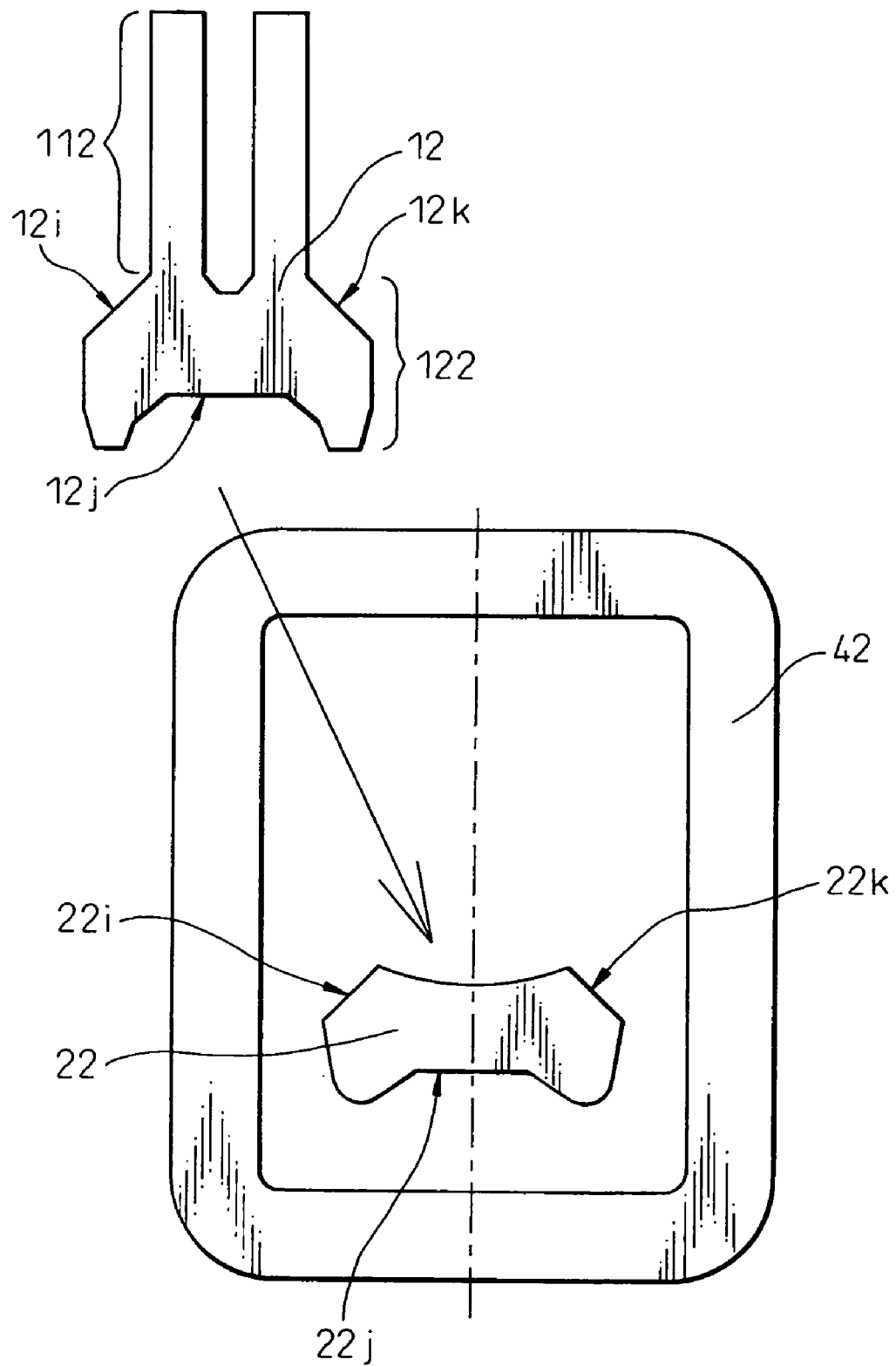
FIG. 6 is a plan view showing the mounting position of a crystal plate in a crystal device according to a third embodiment.

FIG. 6 is a plan view showing the mounting position of a crystal plate and a package provided with a mounting base having a bonding face whose shape is defined by three straight line portions and curved line portions in a crystal device according to the present invention.

As shown in FIG. 6, the base portion 122 of the crystal plate 12 according to the present embodiment has a complicated outer shape. Often, the base portion 122 has to be formed in such a complicated shape to meet the performance requirements of the crystal device or because of the arrangement of electrodes. A plurality of vibrating prongs 112 are protruding from the base portion 122. The crystal plate 12 having such a complicated outer shape can be easily formed by etching.

The base portion 122 of the crystal plate 12 according to the present embodiment has a plan shape formed by an outline having three straight line portions 12i, 12j, and 12k and line segments joining the straight line portions.

On the other hand, the mounting base 21 is provided inside the package 42 in which the crystal plate 12 is mounted, and the base portion 122 of the crystal plate 12 is bonded to the mounting base 22 by an adhesive or the like.

The upper face of the mounting base 22, i.e., the face to which the base portion 122 of the crystal plate 12 is to be bonded, has an outer shape formed by an outline having three straight line portions 22i, 22j, and 22k and curves joining them.

Figure 7:
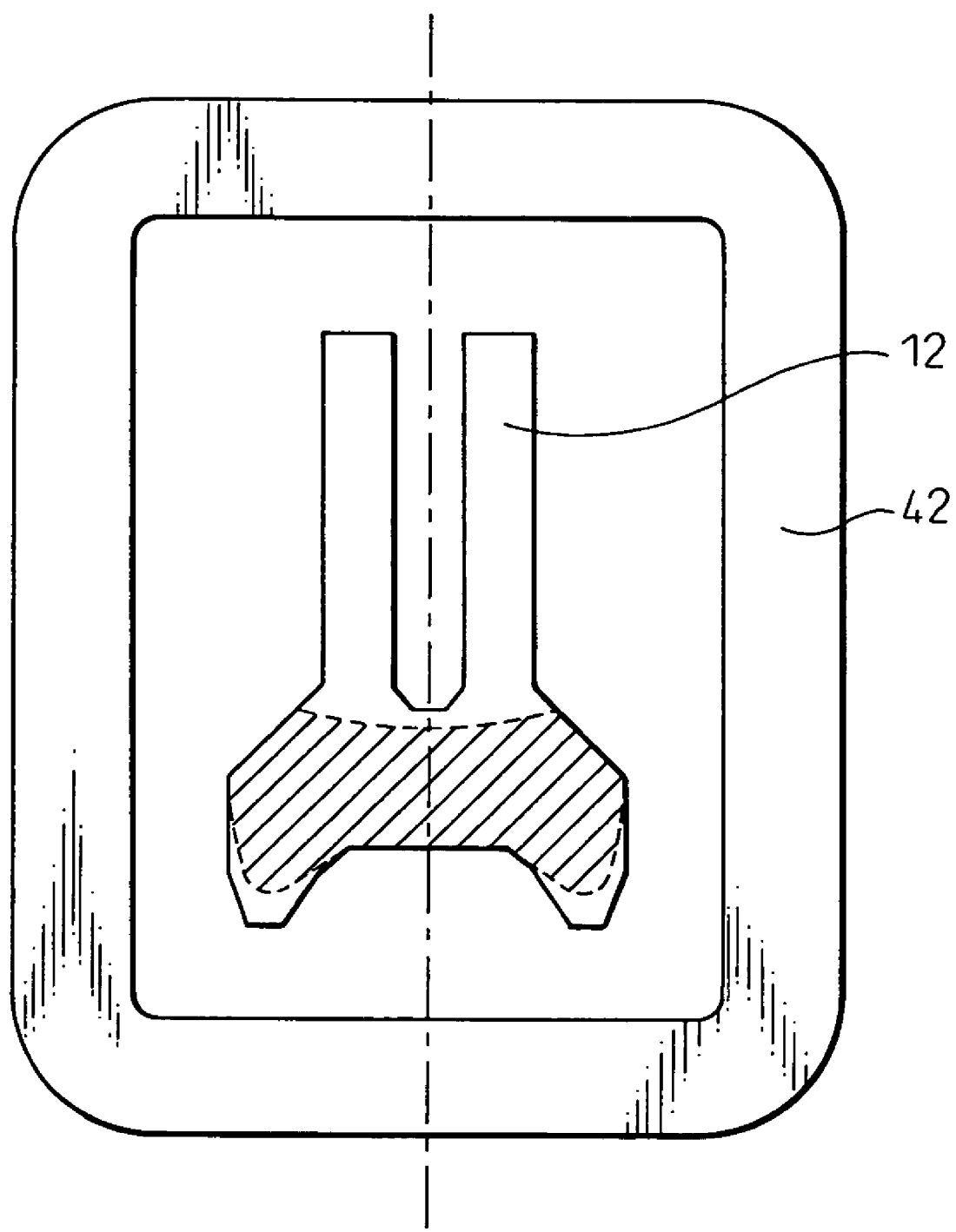
FIG. 7 is a diagram showing the condition in which the crystal plate is bonded to a mounting base in the crystal device according to the third embodiment.

FIG. 7 is a diagram showing the condition in which the crystal plate 12 shown in FIG. 6 is bonded to the mounting base 22.

In FIG. 7, the area shown by oblique hatching indicates the portion where the crystal plate 12 is bonded to the mounting base 21 by an adhesive. As can be seen from the bonding condition shown in FIG. 7 and the shapes of the crystal plate 12 and mounting base 22 shown in FIG. 6, in the crystal device according to the present invention, the crystal plate 12 is bonded to the mounting base 22 with the straight outline portion 12i of the base portion 122 of the crystal plate 12 aligned with the straight outline portion 22i of the bonding face of the mounting base 22, the straight outline portion 12j of the base portion 122 of the crystal plate 12 aligned with the straight outline portion 22j of the bonding face of the mounting base 22, and the straight outline portion 12k of the base portion 122 of the crystal plate 12 aligned with the straight outline portion 22k of the bonding face of the mounting base 22.

In the above structure also, positioning relatively free from placement errors can be accomplished by performing the positioning while recognizing the positions of the three straight line portions 12i, 12j, and 12k (first reference) of the base portion 122 of the crystal plate 12 and the positions of the three straight line portions 22i, 22j, and 22k (second reference) of the mounting base 22. Further, as the crystal plate 12 is accurately positioned relative to the mounting base 22 by also using the first reference, the second reference, and the self-alignment effect of the adhesive, the positioning accuracy can be greatly increased compared with any prior known method. As a result, the reliability of the crystal device can be enhanced, while permitting its size to be reduced.

Fourth Embodiment

Figure 8A:
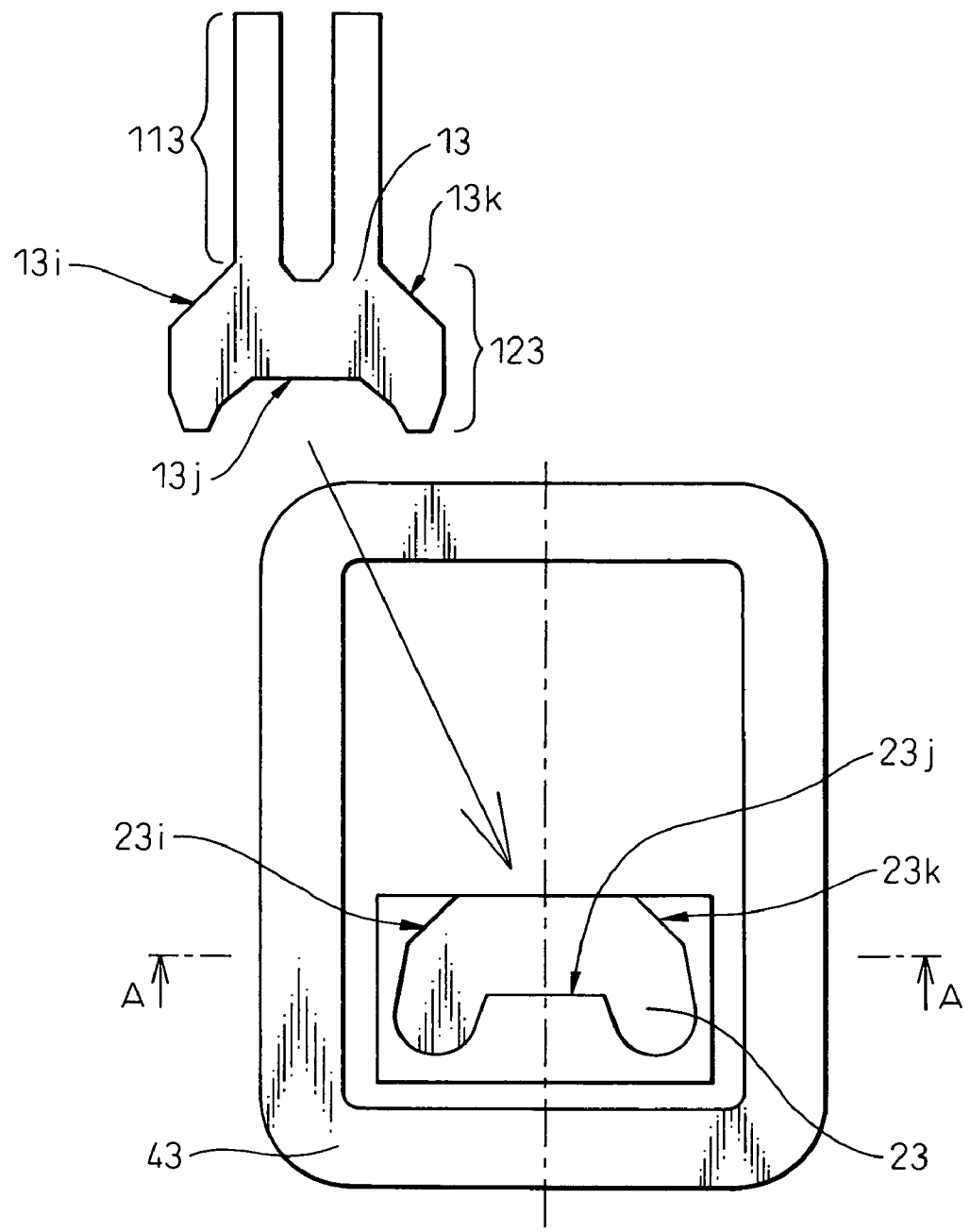
FIG. 8A is a plan view showing the mounting position of a crystal plate in a crystal device according to a fourth embodiment.

FIG. 8A is a plan view showing the mounting position of a crystal plate and a package provided with a mounting base having a recess whose bottom face is a bonding face and whose shape is defined by three straight line portions and curved line portions in a crystal device according to the present invention.

As shown in FIG. 8A, the base portion 123 of the crystal plate 13 according to the present embodiment has a complicated outer shape, and a plurality of vibrating prongs 113 protrude from the base portion 123.

The base portion 123 of the crystal plate 13 according to the present embodiment has a plan shape formed by an outline having three straight line portions 13i, 13j, and 13k and line segments joining the straight line portions.

Figure 8B:
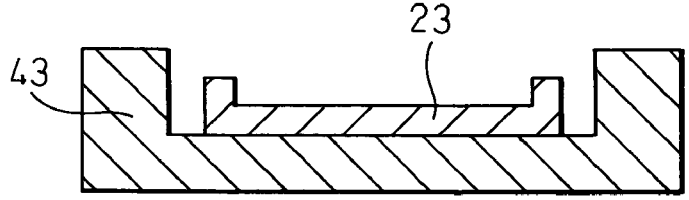
FIG. 8B is a cross-sectional view of the structure shown in FIG. 8A.

FIG. 8B is a cross-sectional view taken along line A-A in FIG. 8A.

As shown in FIG. 8B, the mounting base 23 having a partially recessed shape is provided inside the package 43 in which the crystal plate 13 is mounted. The base portion 123 of the crystal plate 13 is bonded by an adhesive or the like to the bottom face of the recess formed in the mounting base 23. Accordingly, the bottom face of the recess formed in the mounting base 23 is the bonding face in the present embodiment.

The bottom face of the recess formed in the mounting base 23, i.e., the face to which the base portion 123 of the crystal plate 13 is to be bonded, has an outer shape formed by an outline having three straight line portions 23i, 23j, and 23k and curves joining them.

FIG. 9 is a diagram showing the condition in which the crystal plate 13 shown in FIG. 8A is bonded to the mounting base 23.

In FIG. 9, the area shown by oblique hatching indicates the portion where the crystal plate 13 is bonded to the mounting base 23 by an adhesive. As can be seen from the bonding condition shown in FIG. 9 and the shapes of the crystal plate 13 and mounting base 23 shown in FIG. 8A, in the crystal device according to the present invention, the crystal plate 13 is bonded to the mounting base 23 with the straight outline portion 13i of the base portion 123 of the crystal plate 13 aligned with the straight outline portion 23i of the bonding face of the mounting base 23, the straight outline portion 13j of the base portion 123 of the crystal plate 13 aligned with the straight outline portion 23j of the bonding face of the mounting base 23, and the straight outline portion 13k of the base portion 123 of the crystal plate 13 aligned with the straight outline portion 23k of the bonding face of the mounting base 23.

In the above structure also, positioning relatively free from placement errors can be accomplished by performing the positioning while recognizing the positions of the three straight line portions 13i, 13j, and 13k (first reference) of the base portion 123 of the crystal plate 13 and the positions of the three straight line portions 23i, 23j, and 23k (second reference) of the mounting base 23. In the present embodiment, it has been verified that hardly any placement errors occur, because the bonding face (the bottom face of the recess) of the mounting base 23 is enclosed by a wall and the base portion 123 of the crystal plate 13 is fitted into it to accomplish positioning. Furthermore, the base portion 123 of the crystal plate 13 is also positioned relative to the bonding face (the bottom face of the recess) of the mounting base 23 by using the first reference, the second reference, and the self-alignment effect of the adhesive. Accordingly, in the present embodiment also, the crystal plate 13 can be accurately positioned and bonded in the prescribed position inside the package 43 and, as a result, the reliability of the crystal device can be enhanced while its size can be reduced.

Fifth Embodiment

Figure 10A:
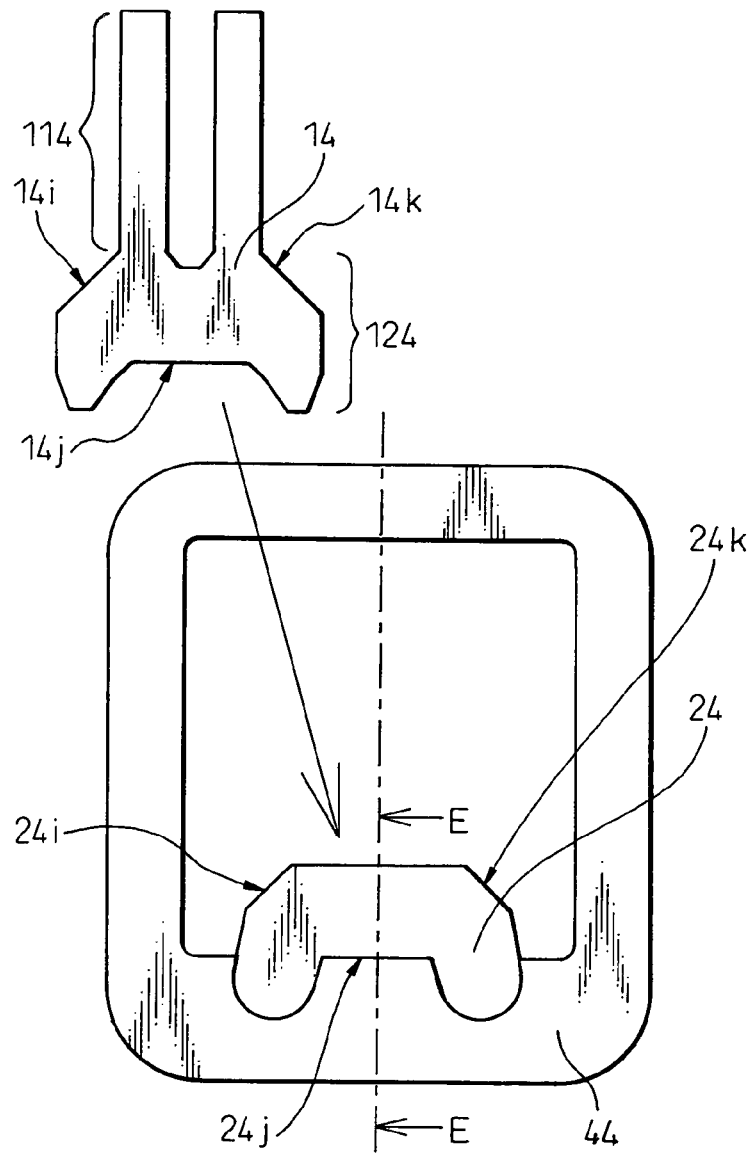
FIG. 10A is a plan view showing the mounting position of a crystal plate in a crystal device according to a fifth embodiment.

FIG. 10A is a plan view showing the mounting position of a crystal plate and a package provided with a mounting base having a bonding face whose shape is defined by three straight line portions and curved line portions, one of which is a contact line contacting the package, in a crystal device according to the present invention.

As shown in FIG. 10A, the base portion 124 of the crystal plate 14 according to the present embodiment has a complicated outer shape, and a plurality of vibrating prongs 114 protrude from the base portion 124.

The base portion 124 of the crystal plate 14 according to the present embodiment has a plan shape formed by an outline having three straight line portions 14i, 14j, and 14k and line segments joining the straight line portions.

On the other hand, the mounting base 24 is provided inside the package 44 in which the crystal plate 14 is mounted, and the base portion 124 of the crystal plate 14 is bonded to the mounting base 24 by an adhesive or the like.

The upper face of the mounting base 24, i.e., the face to which the base portion 124 of the crystal plate 14 is to be bonded, has an outer shape formed by an outline having three straight line portions 24i, 24j, and 24k and curves joining them.

Figure 10B:
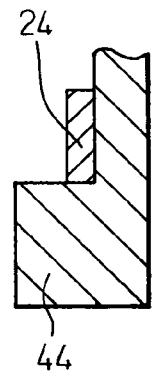
FIG. 10B is a cross-sectional view of the structure shown in FIG. 10A.

FIG. 10B is a cross-sectional view taken along line A-A in FIG. 10A.

As shown in FIG. 10B, the mounting base 24 is formed so as to contact the inside wall of the box-like package 44. Therefore, one of the three straight outline portions of the bonding face of the mounting base 24, i.e., the straight line portion 24j, is formed as a contact line defining the boundary between the package 44 and the mounting base 24.

Figure 11:
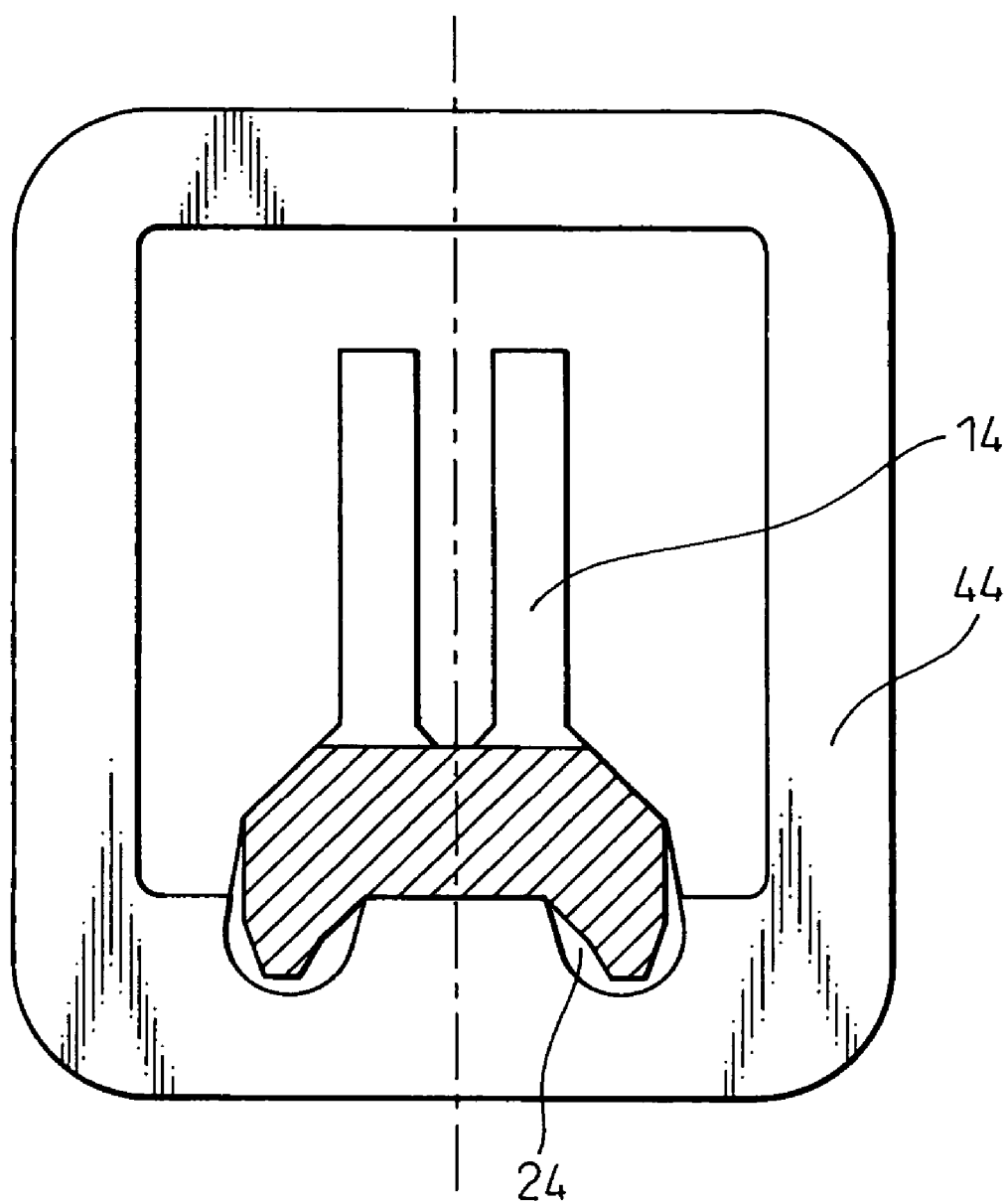
FIG. 11 is a diagram showing the condition in which the crystal plate is bonded to a mounting base in the crystal device according to the fifth embodiment.

FIG. 11 is a diagram showing the condition in which the crystal plate 14 is bonded to the mounting base 24.

In FIG. 11, the area shown by oblique hatching indicates the portion where the crystal plate 14 is bonded to the mounting base 23 by an adhesive. As can be seen from the bonding condition shown in FIG. 11 and the shapes of the crystal plate 14 and mounting base 24 shown in FIG. 10A, in the crystal device according to the present invention, the crystal plate 14 is bonded to the mounting base 24 with the straight outline portion 14i of the base portion 124 of the crystal plate 14 aligned with the straight outline portion 24i of the bonding face of the mounting base 24, the straight outline portion 14j of the base portion 124 of the crystal plate 14 aligned with the straight outline portion 24j of the bonding face of the mounting base 24, and the straight outline portion 14k of the base portion 124 of the crystal plate 14 aligned with the straight outline portion 24k of the bonding face of the mounting base 24.

In the above structure also, positioning relatively free from placement errors can be accomplished by performing the positioning while recognizing the positions of the three straight line portions 14i, 14j, and 14k (first reference) of the base portion 124 of the crystal plate 14 and the positions of the three straight line portions 24i, 24j, and 24k (second reference) of the mounting base 24. Further, in the present embodiment, as the straight line portion 24j is also the contact line contacting the inside wall of the package 44, the crystal plate 14 can be placed by pressing the straight line portion 14j of its base portion 124 against the inside wall of the package 44 contacting the straight line portion 24j. Furthermore, the base portion 124 of the crystal plate 14 is also positioned relative to the mounting base 24 by using the first reference, the second reference, and the self-alignment effect of the adhesive. This serves to further enhance the positioning accuracy. As the crystal plate 14 can be accurately positioned and bonded in the prescribed position inside the package 43 as described above, the reliability of the crystal device can be enhanced, while permitting its size to be reduced.

Sixth Embodiment

FIG. 12A is a plan view showing the mounting position of a crystal plate and a package provided with a mounting base having a wall faces formed in contacting relationship with an outline of a bording face of the crystal device according to the present invention.

The crystal plate 15 used in the present embodiment comprises a base portion 125 and a plurality of vibrating prongs 115 protruding from the base portion 125.

The base portion 125 of the crystal plate 15 according to the present embodiment has a substantially rectangular plan shape having three straight line portions. Accordingly, the base portion 125 of the crystal plate 15 necessarily has three side wall faces 15p, 15q, and 15r with the three straight line portions defining boundaries to the plane surface. These three side wall faces 15p, 15q, and 15r are all non-curved faces.

FIG. 12B is a cross-sectional view taken along line B-B in FIG. 12A.

As shown in FIG. 12B, the mounting base 25 with a wall formed along the periphery of its bonding face to be bonded to the crystal plate 15 is provided inside the package 45 in which the crystal plate 15 is mounted. The base portion 125 of the crystal plate 15 is bonded to the bonding face of the mounting base 25 by an adhesive or the like.

The bonding face of the mounting base 25 has a rectangular outer shape, and wall faces 25p and 25q are formed along two peripheral sides of the bonding face.

Figure 13A:
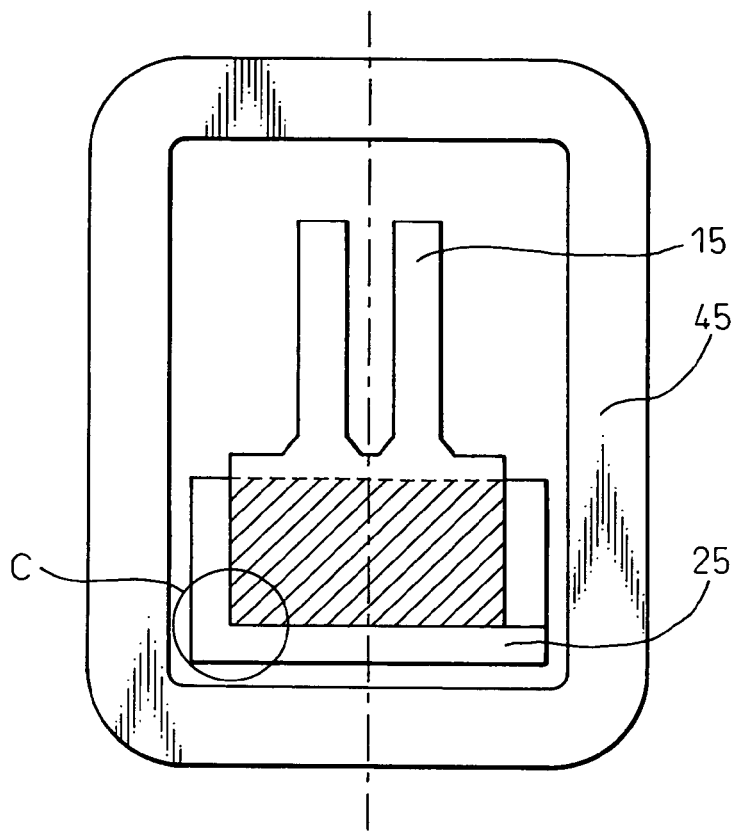
FIG. 13A is a diagram showing the condition in which the crystal plate is bonded to a mounting base in the crystal device according to the sixth embodiment.

FIG. 13A is a diagram showing the condition in which the crystal plate 15 is bonded to the mounting base 25.

In FIG. 13A, the area shown by oblique hatching indicates the portion where the crystal plate 15 is bonded to the mounting base 25 by an adhesive. As shown in FIG. 13A, in the present embodiment, the side wall face 15p of the base portion 125 of the crystal plate 15 is bonded face-to-face to the wall face 25p formed in contacting relationship with the bonding face of the mounting base 25, and the side wall face 15q of the base portion 125 of the crystal plate 15 is bonded face-to-face to the wall face 25q formed in a contacting relationship with the bonding face of the mounting base 25.

In the present embodiment having the above structure, positioning is performed by recognizing the outlines of the side wall faces 15p and 15q (first reference) of the base portion 125 of the crystal plate 15 and the outlines of the wall faces 25p and 25q (second reference) formed along the periphery of the bonding face of the mounting base 25.

As a result, the surface tension of the adhesive 30 acts, as described below, between the side wall face 15p of the base portion 125 of the crystal plate 15 and the wall face 25p formed on the mounting base 25 and also between the side wall face 15q of the base portion 125 of the crystal plate 15 and the wall face 25q formed on the mounting base 25.

Figure 13B:
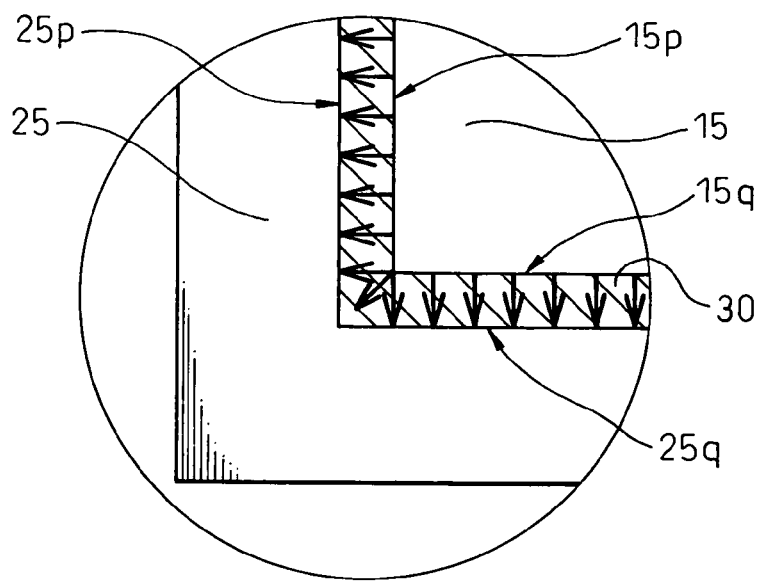
FIG. 13B is an enlarged view of a portion of FIG. 13A.

FIG. 13B is an enlarged view of the portion C in FIG. 13A.

As seen in the enlarged view of FIG. 13B, a very small gap may occur between the side wall face 15p of the base portion 125 of the crystal plate 15 and the wall face 25p formed on the mounting base 25 and also between the side wall face 15q of the base portion 125 of the crystal plate 15 and the wall face 25q formed on the mounting base 25. In that case, the adhesive 30, which is a viscous fluid, penetrates into the gap by capillary action. Further, because of the surface tension of the adhesive 30, the side wall face 15p of the crystal plate 15 is pulled toward the wall face 25p formed on the mounting base 25, and likewise, the side wall face 15q of the crystal plate 15 is pulled toward the wall face 25q formed on the mounting base 25.

Using the first reference, the second reference, and the self-alignment effect of the adhesive described above, the crystal plate 15 is accurately fixed to the wall faces formed on the mounting base 25. In this way, in the present embodiment also, positioning relatively free from placement errors can be accomplished and, as a result, the reliability of the crystal device can be enhanced, while permitting its size to be reduced.

Seventh Embodiment

Figure 14A:
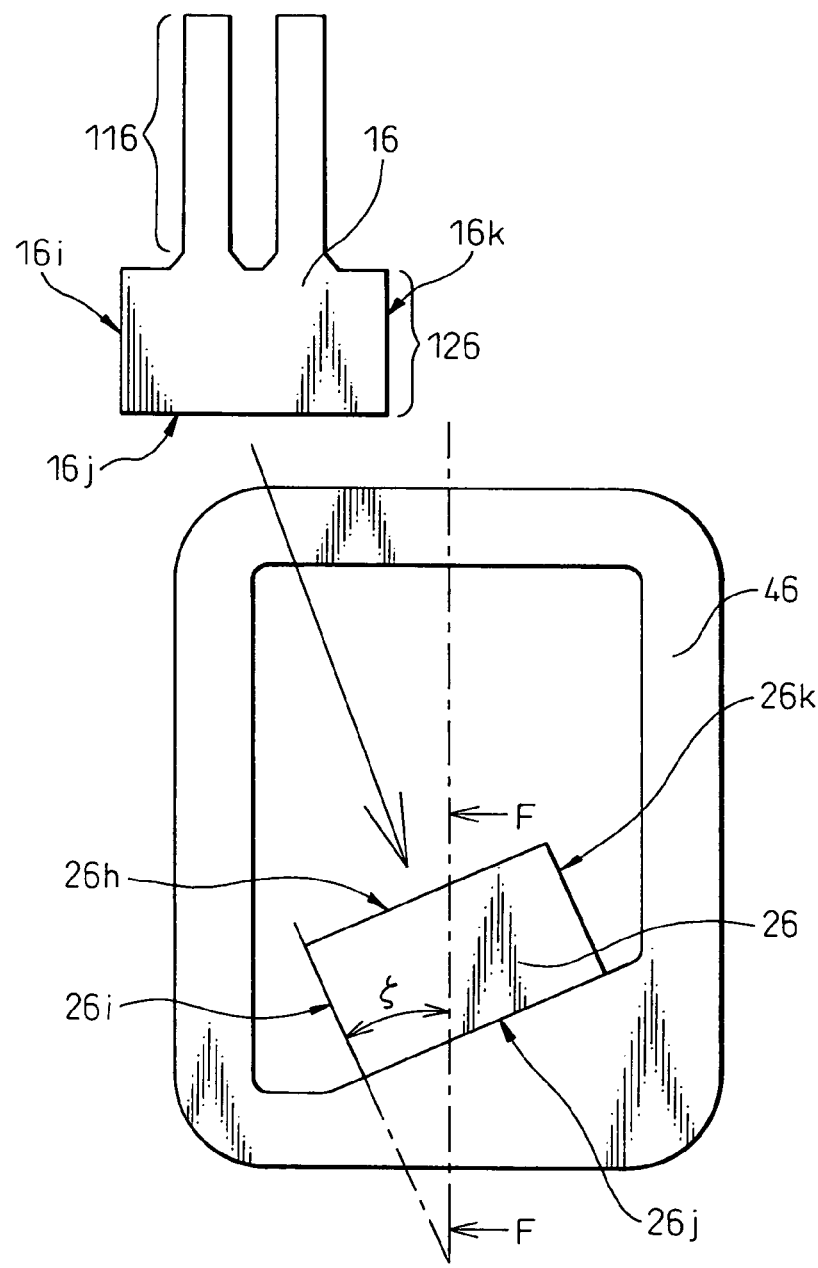
FIG. 14A is a plan view showing the mounting position of a crystal plate in a crystal device according to a seventh embodiment.

FIG. 14A is a plan view showing the mounting position of a crystal plate and a package provided with a mounting base having a rectangular bonding face a portion of whose outline forms a contact line contacting the package in a crystal device according to the present invention.

The crystal plate 16 used in the crystal device according to the present invention comprises a base portion 126 and a plurality of vibrating prongs 116 protruding from the base portion 126.

In the present embodiment, the base portion 126 of the crystal plate 16 has a plan shape formed by an outline having three straight line portions 16i, 16j, and 16k. The straight line portions 16i and 16k extend in parallel to the longitudinal direction of the vibrating prongs 116, while the straight line portion 16j extends in a direction perpendicular to the straight line portions 16i and 16k.

On the other hand, the mounting base 26 is provided inside the package 46 in which the crystal plate 16 is mounted, and the base portion 126 of the crystal plate 16 is bonded to the mounting base 26 by an adhesive or the like.

Figure 14B:
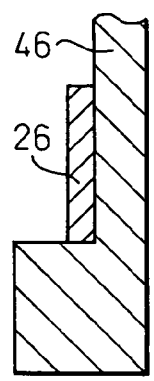
FIG. 14B is a cross-sectional view of the structure shown in FIG. 14A.

FIG. 14B is a cross-sectional view taken along line F-F in FIG. 14A.

As shown in FIG. 14B, the upper face of the mounting base 26, i.e., the face to which the base portion 126 of the crystal plate 16 is to be bonded, has a rectangular shape defined by four straight line portions 26h, 26i, 26j, and 26k. Further, the mounting base 26 is formed so as to contact the inside wall of the box-like package 46. Therefore, one of the four straight outline portions of the bonding face of the mounting base 26, i.e., the straight line portion 26j, is formed as a contact line defining the boundary between the package 46 and the mounting base 26.

In the present embodiment, of the outline portions of the mounting base 26, the straight line portions 26i and 26k are inclined by a prescribed angle ζ with respect to the center line of the package 46.

Figure 15:
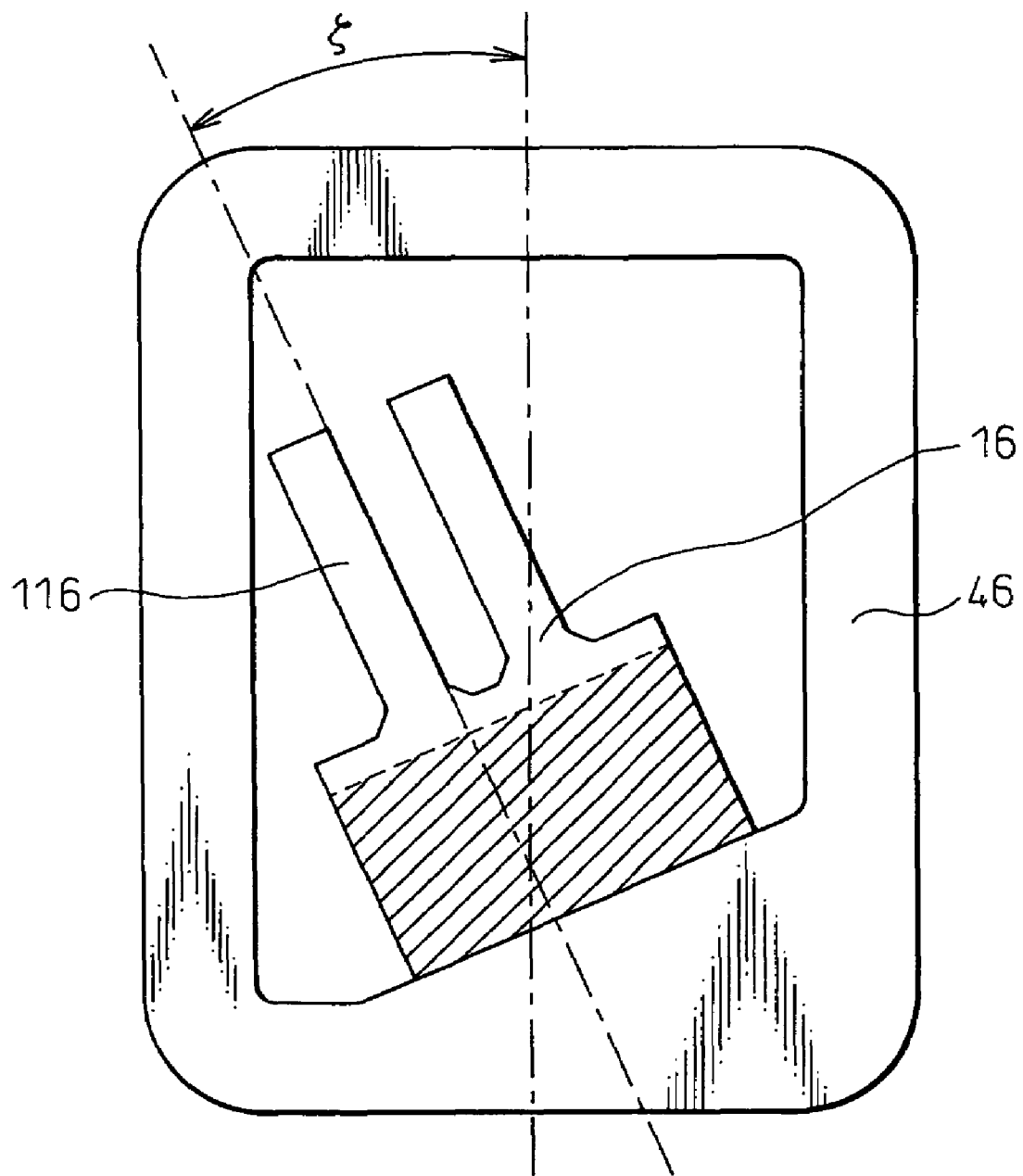
FIG. 15 is a diagram showing the condition in which the crystal plate is bonded to a mounting base in the crystal device according to the seventh embodiment.

FIG. 15 is a diagram showing the condition in which the crystal plate 16 is bonded to the mounting base 26.

In FIG. 15, the area shown by oblique hatching indicates the portion where the crystal plate 16 is bonded to the mounting base 26 by an adhesive. As can be seen from the bonding condition shown in FIG. 15 and the shapes of the crystal plate 16 and mounting base 26 shown in FIG. 14A, in the present embodiment, the crystal plate 16 is bonded to the mounting base 26 with the straight outline portion 16i of the base portion 126 of the crystal plate 16 aligned with the straight outline portion 26i of the bonding face of the mounting base 26, the straight outline portion 16j of the base portion 126 of the crystal plate 16 aligned with the straight outline portion 26j of the bonding face of the mounting base 26, and the straight outline portion 16k of the base portion 126 of the crystal plate 16 aligned with the straight outline portion 26k of the bonding face of the mounting base 26.

In this way, in the present embodiment, the crystal plate 16 can be bonded with the longitudinal direction of its vibrating prongs 116 inclined by the prescribed angle ζ with respect to the center line of the package 46. In this structure also, by performing the positioning while recognizing the positions of the three straight line portions 16i, 16j, and 16k (first reference) of the base portion 126 of the crystal plate 16 and the positions of the three straight line portions 26i, 26j, and 26k (second reference) of the mounting base 26, the positioning can be accomplished with an accuracy of a few degrees or better relative to the prescribed angle ζ.

Further, in the present embodiment, as the straight line portion 26j is also the contact line contacting the inside wall of the package 46, the crystal plate 16 can be placed by pressing the straight line portion 16j of its base portion 126 against the inside wall of the package 46 contacting the straight line portion 26j. Furthermore, the base portion 126 of the crystal plate 16 is also positioned relative to the mounting base 26 by using the first reference, the second reference, and the self-alignment effect of the adhesive. This serves to further enhance the positioning accuracy. In the present embodiment, since the crystal plate 16 can be accurately positioned and bonded in the prescribed position at the prescribed angle ζ inside the package 46, the reliability of the crystal device can be enhanced, while permitting its size to be reduced.

The structure of the crystal device according to the present embodiment can be advantageously applied to a gyro sensor device as one application of the crystal device. Here, the gyro sensor device generally refers to an angular velocity sensor that uses a crystal plate, and operates on the principle that when the crystal plate is spun with its prongs vibrating, a Coriolis force is generated in the direction perpendicular to the direction of vibration. Angular velocity can be detected based on the magnitude of the Coriolis force.

Figure 16A:
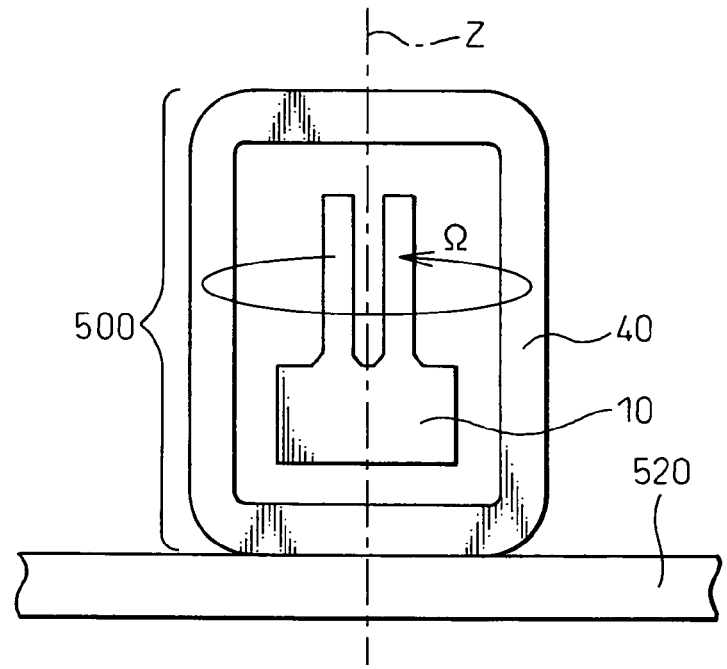
FIGS. 16A and 16B are diagrams each showing the relationship between the mounting angle of a gyro sensor device in a navigation system and the axis of a spin whose angular velocity is to be detected.
Figure 16B:
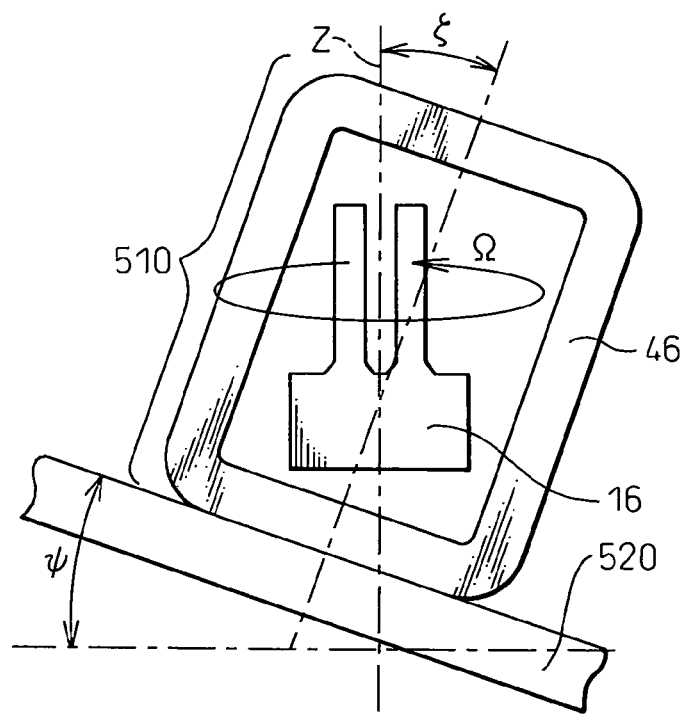

FIG. 16 is a diagram showing the relationship between the mounting angle of the gyro sensor device in a conventional navigation system and the axis of spin whose angular velocity is to be detected. FIG. 16A shows the condition in which the gyro sensor device 500 is mounted on a circuit board 520 placed in a plane perpendicular to the spinning axis Z whose angular velocity Ω is to be detected. On the other hand, FIG. 16B shows the condition in which the gyro sensor device 510 is mounted on the circuit board 520 which is inclined by an angle 4 with respect to the plane perpendicular to the spinning axis Z whose angular velocity Ω is to be detected.

The gyro sensor device 500 is mounted on the circuit board 520 so that its center axis is substantially perpendicular to the horizontal plane. Accordingly, when the circuit board 520 is placed in a plane perpendicular to the spinning axis Z as shown in FIG. 16A, the crystal plate 10 should be bonded so that its vibrating prongs 40 are oriented parallel to the center axis of the package 40 (refer to the first embodiment).

On the other hand, when the circuit board 520 is inclined by an angle φ with respect to the plane perpendicular to the spinning axis Z as shown in FIG. 16B, the crystal plate 16 must be bonded with its axis inclined a given optimum angle ζ with respect to the center axis of the package 46 (refer to the seventh embodiment). Here, ζ=φ when the gyro sensor device 510 is mounted on the circuit board 520 so that the center axis of the package 46 is perpendicular to the circuit board 520.

Figure 17:
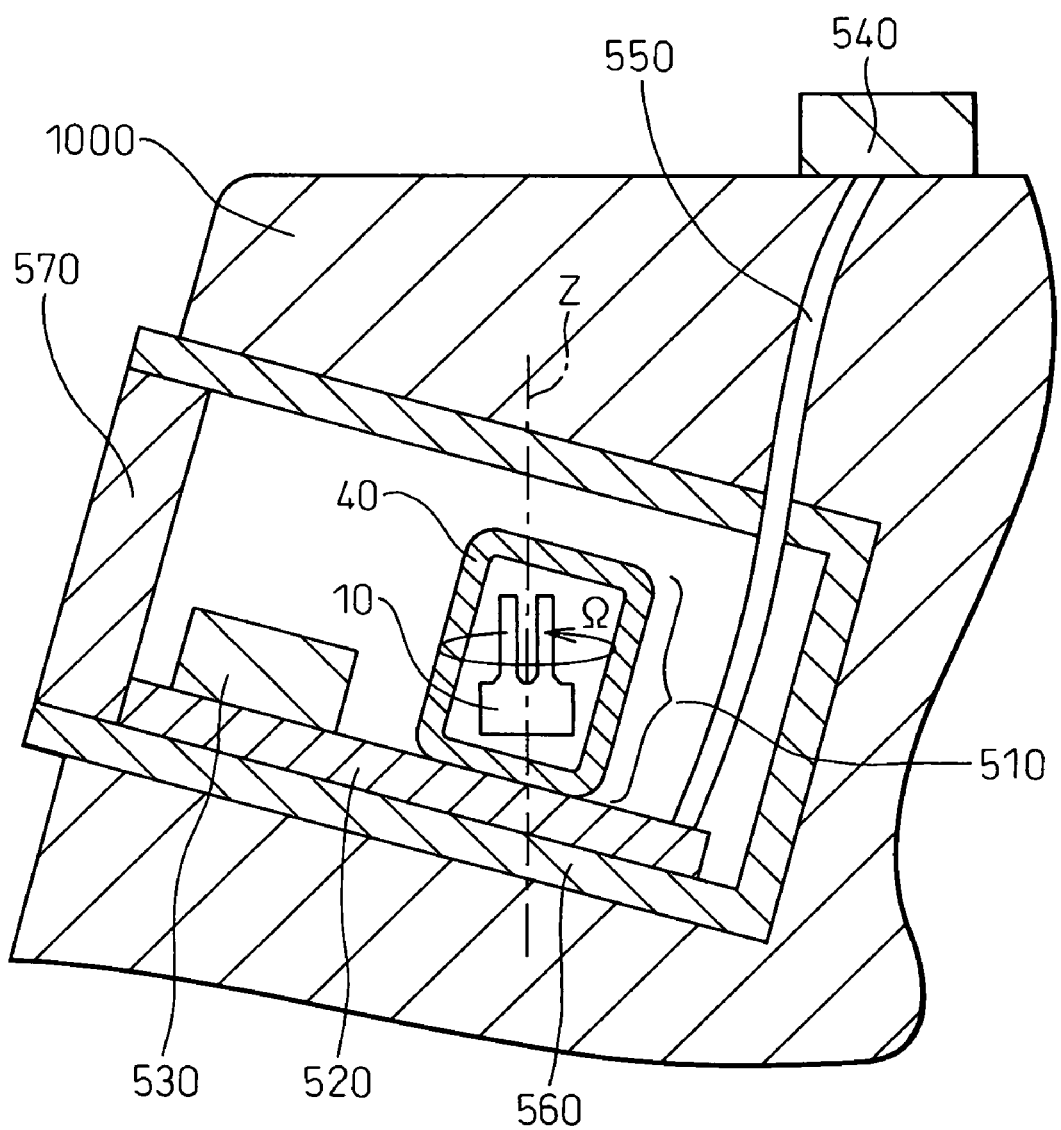
FIG. 17 is a diagram showing the configuration of a navigation system equipped with the gyro sensor device.

FIG. 17 schematically shows the configuration of a navigation system equipped with the gyro sensor device.

FIG. 17 shows the configuration in which the navigation system is embedded in a vehicle's dashboard 1000 (which usually refers to the panel located beneath the windshield and having various gauges and switches grouped together). The navigation system comprises: a GPS (Global Positioning System) antenna 540 for receiving position information signals transmitted from artificial satellites; the gyro sensor device 500 for detecting the angular velocity of the vehicle and converting it into the vehicle's behavioral signal for output; an IC 530 for processing the position information signals, behavioral signals, and the like; a display 570 for displaying images based on the signals processed by the IC 530; a connecting cable 550; and an enclosure 560 for protecting the circuit board 520 and other internal components from impact.

When the navigation system is embedded in the dashboard 1000 as shown in FIG. 17, usually, the navigation system is mounted at an angle so that the driver can easily view the images displayed on the display 510.

However, the spinning axis Z about which the angular velocity Ω is to be detected is always oriented in the same direction regardless of the mounting angle of the navigation system relative to the vehicle body, and the crystal plate 10 must always be mounted with the longitudinal direction of its vibrating prongs oriented parallel to the spinning axis Z. Otherwise, the angular velocity Ω cannot be detected accurately.

Accordingly, in this case, if the angular velocity Ω is to be detected accurately, the crystal plate 10 must be mounted in a inclined position inside the package 40 so that the vibrating prongs of the crystal plate 10 are oriented parallel to the spinning axis Z.

When the crystal device of the present embodiment, such as shown in FIG. 15, is used as the gyro sensor device, as the crystal plate 16 can be accurately positioned and bonded in the prescribed position at the prescribed angle ζ inside the package 46, the crystal device of the present embodiment is ideally suited for use as the gyro sensor device 500 that is built into the navigation system mounted at an angle as shown in FIG. 17.

Eighth Embodiment

Figure 18:
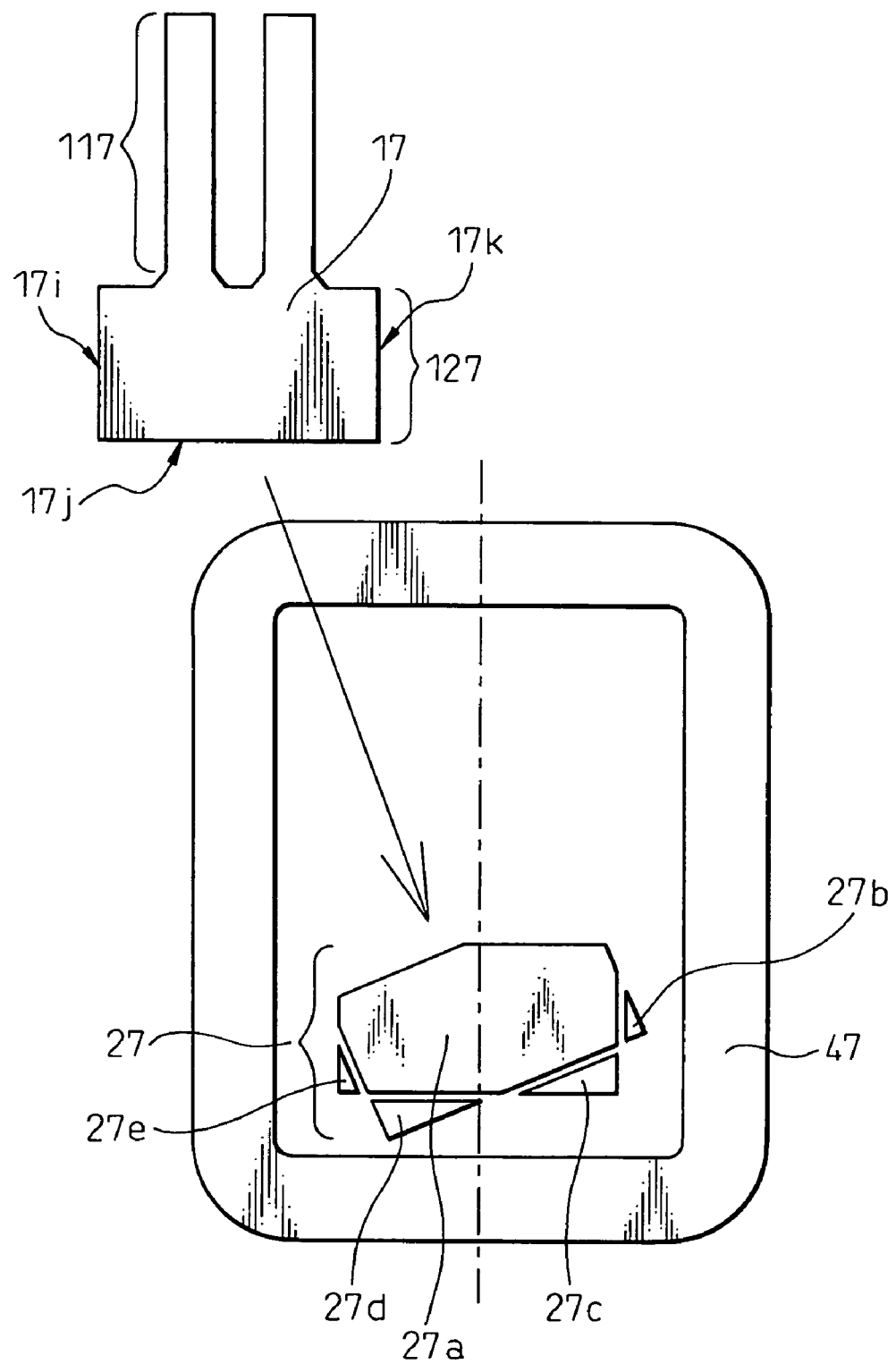
FIG. 18 is a plan view showing the mounting position of a crystal plate in a crystal device according to an eighth embodiment.

FIG. 18 is a plan view showing the mounting position of a crystal plate and a package provided with a mounting base comprising a group of a plurality of projections in a crystal device according to the present invention.

The crystal plate 17 used in the crystal device according to the present embodiment comprises a base portion 127 and a plurality of vibrating prongs 117 protruding from the base portion 127.

In the present embodiment, the base portion 127 of the crystal plate 17 has a plan shape formed by an outline having three straight line portions 17i, 17j, and 17k, and the straight line portions 17i and 17k are arranged parallel to each other, while the straight line portion 17j is perpendicular to the straight line portions 17i and 17k.

On the other hand, the mounting base 27 is provided inside the package 47 in which the crystal plate 17 is mounted, and the base portion 127 of the crystal plate 17 is bonded to the mounting base 27 by an adhesive or the like.

In the present embodiment, the mounting base 27 comprises, as shown in FIG. 18, a group of five projections 27a, 27b, 27c, 27d, and 27e formed protruding from one plane surface of the package 47. In the present invention, the mounting base refers to a structure having a face to which the crystal plate is bonded, and a structure formed by grouping a plurality of projections within a predefined area, as shown here, can also be considered as one form of the mounting base.

Figure 19:
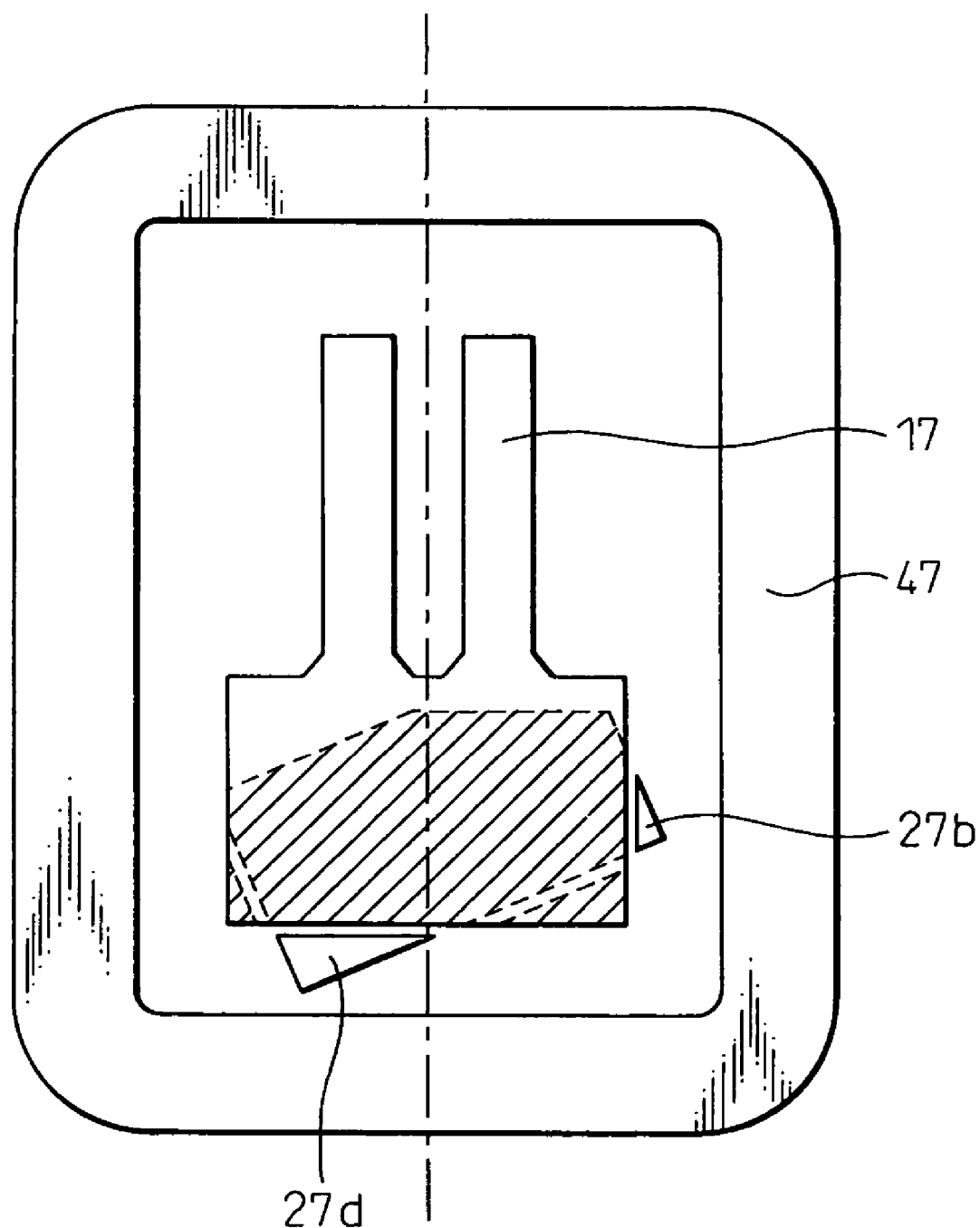
FIG. 19 is a diagram showing one example of the condition in which the crystal plate is bonded to a mounting base in the crystal device according to the eighth embodiment.

FIG. 19 shows one example of the condition in which the crystal plate 17 is bonded to the mounting base 27 including a group of a plurality of projections.

In FIG. 19, the area shown by oblique hatching indicates the portion where the crystal plate 17 is bonded to the mounting base 27 by an adhesive. In FIG. 19, of the five projections, the adhesive is applied over the upper faces of the projections 27a, 27c, and 27e to bond the crystal plate 17 to the mounting base 27. Accordingly, in the crystal device according to the present embodiment, as can be seen from the bonding condition shown in FIG. 19 and the shapes of the crystal plate 17 and mounting base 27 shown in FIG. 18, the crystal plate 17 is bonded to the mounting base 27 with the straight outline portion 17*i* of the base portion 127 of the crystal device 17 partially overlapping the outlines of the projections 27*a* and 27*e*, the straight outline portion 17*j* of the base portion 127 of the crystal device 17 partially overlapping the outlines of the projections 27*a*, 27*c*, and 27*e*, and the straight outline portion 17*k* of the base portion 127 of the crystal device 17 partially overlapping the outlines of the projections 27*a* and 27*c*.

That is, it can be seen that, in the present embodiment shown in FIG. 19, the projections 27*a*, 27*c*, and 27*e* have outlines corresponding in position to the three straight line portions 17*i*, 17*j*, and 17*k* of the base portion 127 of the crystal plate 17. Accordingly, the present embodiment shown in FIG. 19 also satisfies the condition, i.e., the feature of the present invention, that the outline of the mounting base face to which the crystal plate is to be bonded includes three straight line portions corresponding in position to any three straight line portions defining the outline of the base portion of the crystal plate.

In the above structure also, positioning relatively free from placement errors can be accomplished by performing the positioning while recognizing the positions of the three straight line portions 17*i*, 17*j*, and 17*k* (first reference) of the base portion 127 of the crystal plate 17 and the outlines of the projections 27*a*, 27*c*, and 27*e* (second reference) of the mounting base 27. Further, since accurate positioning can also be accomplished using the first reference, the second reference, and the self-alignment effect of the adhesive, the positioning accuracy can be greatly increased compared with any prior known method. As a result, the reliability of the crystal device can be enhanced, while permitting its size to be reduced.

Figure 20:
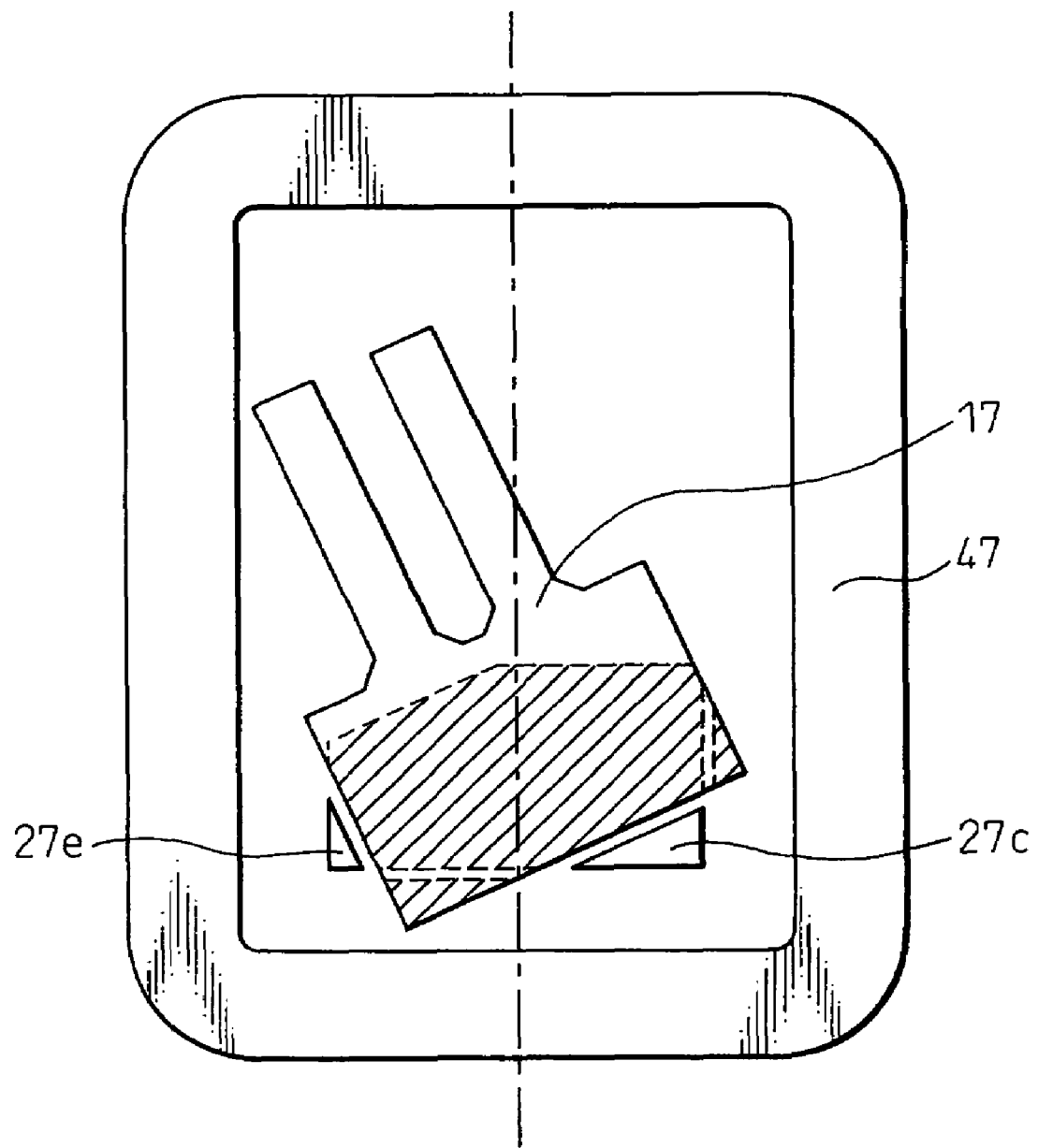
FIG. 20 is a diagram showing another example of the condition in which the crystal plate is bonded to the mounting base in the crystal device according to the eighth embodiment.

FIG. 20 shows another example of the condition in which the crystal plate 17 is bonded to the mounting base 27 including a group of a plurality of projections.

In FIG. 20, the area shown by oblique hatching indicates the portion where the crystal plate 17 is bonded to the mounting base 27 by an adhesive. In FIG. 20, of the five projections, the adhesive is applied over the upper faces of the projections 27*a*, 27*b*, and 27*d* to bond the crystal plate 17 to the mounting base 27. Accordingly, in the crystal device according to the present embodiment, as can be seen from the bonding condition shown in FIG. 20 and the shapes of the crystal plate 17 and mounting base 27 shown in FIG. 18, the crystal plate 17 is bonded to the mounting base 27 with the straight outline portion 17*i* of the base portion 127 of the crystal device 17 partially overlapping the outlines of the projections 27*a* and 27*d*, the straight outline portion 17*j* of the base portion 127 of the crystal device 17 partially overlapping the outlines of the projections 27*a*, 27*b*, and 27*d*, and the straight outline portion 17*k* of the base portion 127 of the crystal device 17 partially overlapping the outlines of the projections 27*a* and 27*b*.

That is, it can be seen that, in the present embodiment shown in FIG. 20, the projections 27*a*, 27*b*, and 27*d* have outlines corresponding in position to the three straight line portions 17*i*, 17*j*, and 17*k* of the base portion 127 of the crystal plate 17. Accordingly, the present embodiment shown in FIG. 20 also satisfies the condition, i.e., the feature of the present invention, that the outline of the mounting base face to which the crystal plate is to be bonded includes three straight line portions corresponding in position to any three straight line portions defining the outline of the base portion of the crystal plate.

In the above structure also, positioning relatively free from placement errors can be accomplished by performing the positioning while recognizing the positions of the three straight line portions 17*i*, 17*j*, and 17*k* (first reference) of the base portion 127 of the crystal plate 17 and the outlines of the projections 27*a*, 27*b*, and 27*d* (second reference) of the mounting base 27. Further, since accurate positioning can also be accomplished using the first reference, the second reference, and the self-alignment effect of the adhesive, the positioning accuracy can be greatly increased compared with any prior known method. As a result, the reliability of the crystal device can be enhanced, while permitting its size to be reduced.

Furthermore, in the present embodiment, the crystal plate 17 can be bonded by inclined it at a prescribed angle with respect to the center axis of the package 47.

In the present embodiment, the mounting base 27 is constructed from five projections 27*a*, 27*b*, 27*c*, 27*d*, and 27*e*, thereby forming many straight line portions along the outline of the mounting base 27 (that is, the outlines of the projections 27*a*, 27*b*, 27*c*, 27*d*, and 27*e*). By so doing, two sets of three straight line portions corresponding in position to the three straight line portions 17*i*, 17*j*, and 17*k* of the base portion 127 of the crystal plate 17 can be formed along the outline of the mounting base 27. This enables the crystal plate 17 to be mounted at two different angles, whichever is suitable, inside the package.

In this way, one advantage of the present embodiment is that the crystal plate 17 can be accurately bonded at any one of two different angles while using the package 47 of the same shape. To enable the crystal plate 17 to be mounted at two or more different angles, at least four straight line portions must be formed along the outline of the mounting base 27. If there are four or more straight line portions, two or more sets of three straight line portions can be formed, making it possible to mount the crystal plate 17 at two or more different angles.

This advantage of the present embodiment is very effective when using the crystal device as a gyro sensor device as one application of the crystal device. When the navigation system is embedded in the dashboard 1000 as shown in FIG. 17, usually the navigation system is mounted at an angle so that the driver can easily view the images displayed on the display 510. In that case, the gyro sensor device 510 mounted on the circuit board 520 is also installed at an angle inside the navigation system.

In the above case, the mounting condition of the gyro sensor device 510 on the circuit board 520 and the bonding condition of the crystal plate inside the gyro sensor device 510 are as shown in FIG. 16B. In the case of FIG. 16B, as the crystal plate must be bonded with its vibrating prongs inclined at a prescribed angle $\zeta$ with respect to the center axis of the package, the crystal device configuration such as shown in FIG. 20 can be used.

It will, however, be noted that the navigation system is not always mounted in the vehicle in the same manner as shown in FIG. 17. Depending on the structure of the vehicle body, it is often preferable to mount the navigation system in parallel to the road. In that case, the mounting condition of the gyro sensor device 510 on the circuit board 520 and the bonding condition of the crystal plate inside the gyro sensor device 510 are as shown in FIG. 16A. In the case of FIG. 16A, as the crystal plate must be bonded with its vibrating prongs oriented parallel to the center axis of the package, a crystal device configuration such as that shown in FIG. 19 can be used.

In this way, when the crystal device of the present embodiment is used as a gyro sensor device in a navigation system, if there are two different ways of mounting the navigation system depending on the type of vehicle, the same configuration can be used in either case.

With the structure and the manufacturing method described above, when the crystal device of the present embodiment is used, the crystal plate can be accurately positioned and bonded in the prescribed position inside the package. This eliminates the problem of the crystal plate coming into contact with the package, and stable vibration characteristics can be obtained. As a result, a highly reliable crystal device can be achieved.

Furthermore, as the crystal plate does not easily contact the package even if the size of the package is reduced, the overall size of the crystal device can be reduced.

When the crystal device according to the present invention is used as a gyro sensor device, there is offered another advantage that the angular velocity can be detected stably with high accuracy.

Further, when the crystal device according to the present invention is used as a gyro sensor device in a navigation system, a gyro sensor device of optimum configuration that matches the use of the navigation system can be easily provided.

Ninth Embodiment

Figure 21:
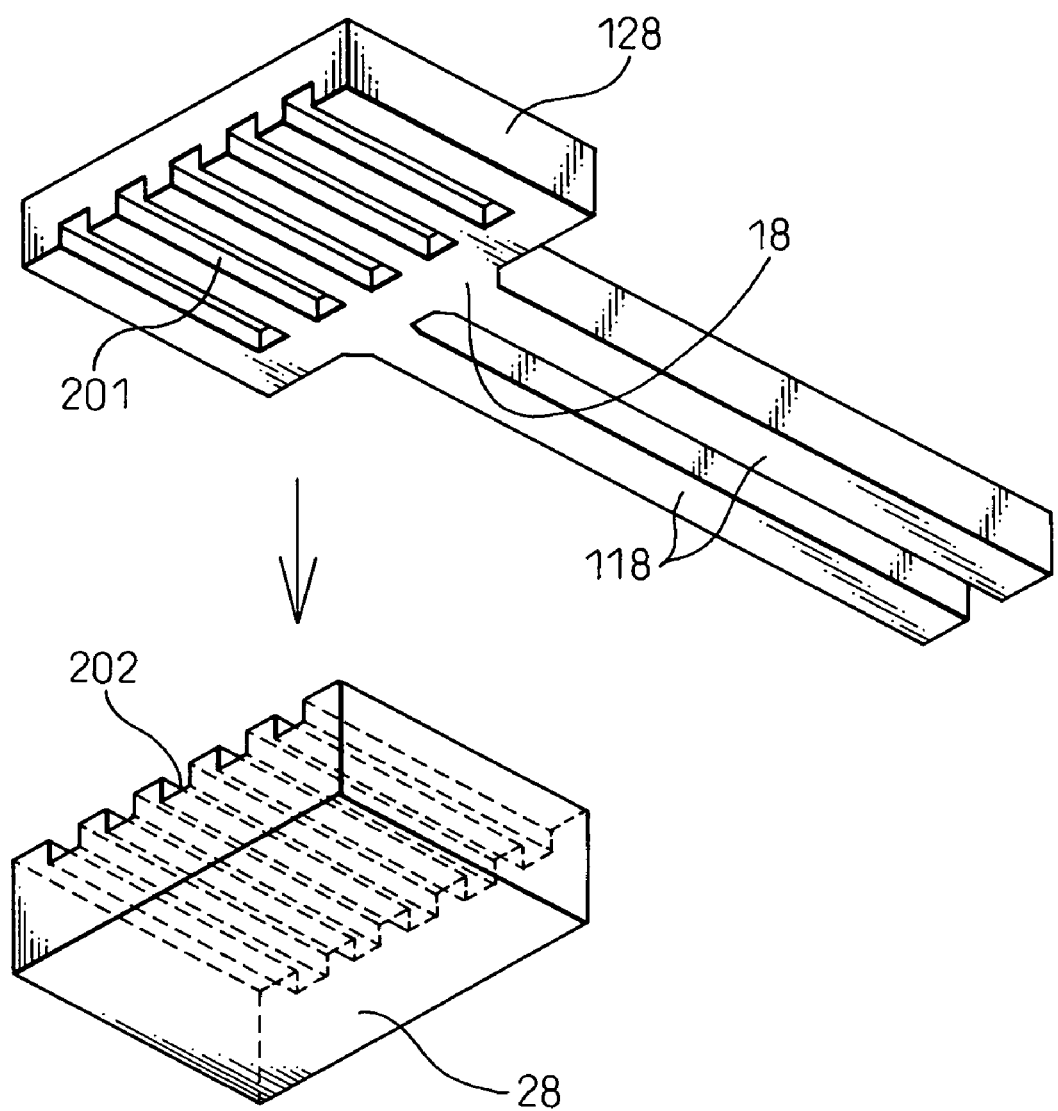
FIG. 21 is a perspective view showing a grooved crystal plate and a grooved mounting base in a crystal device according to a ninth embodiment.

FIG. 21 is a perspective view showing a grooved crystal plate 18 and a grooved mounting base 28 in a crystal device according to the present embodiment.

The grooved crystal plate 18 comprises a base portion 128 and a plurality of vibrating prongs 118 protruding from the base portion 128. A plurality of equally spaced, fine parallel grooves 201 are formed in the face of the base portion 128 of the crystal plate 18 which is to be bonded to the mounting base 28. These fine grooves 201 extend in the same direction as the longitudinal direction of the vibrating prongs 118.

Figure 22:
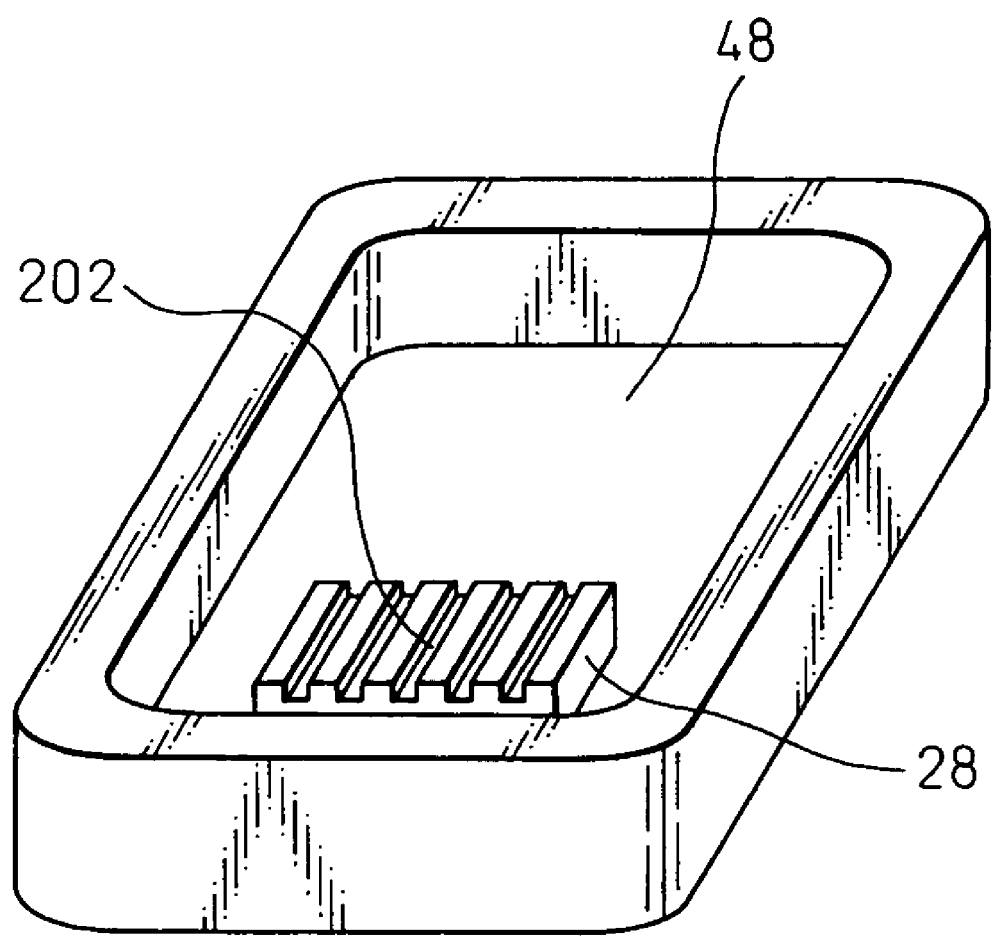
FIG. 22 is a perspective view of a package provided with the grooved mounting base in the crystal device according to the ninth embodiment.
Figure 23:
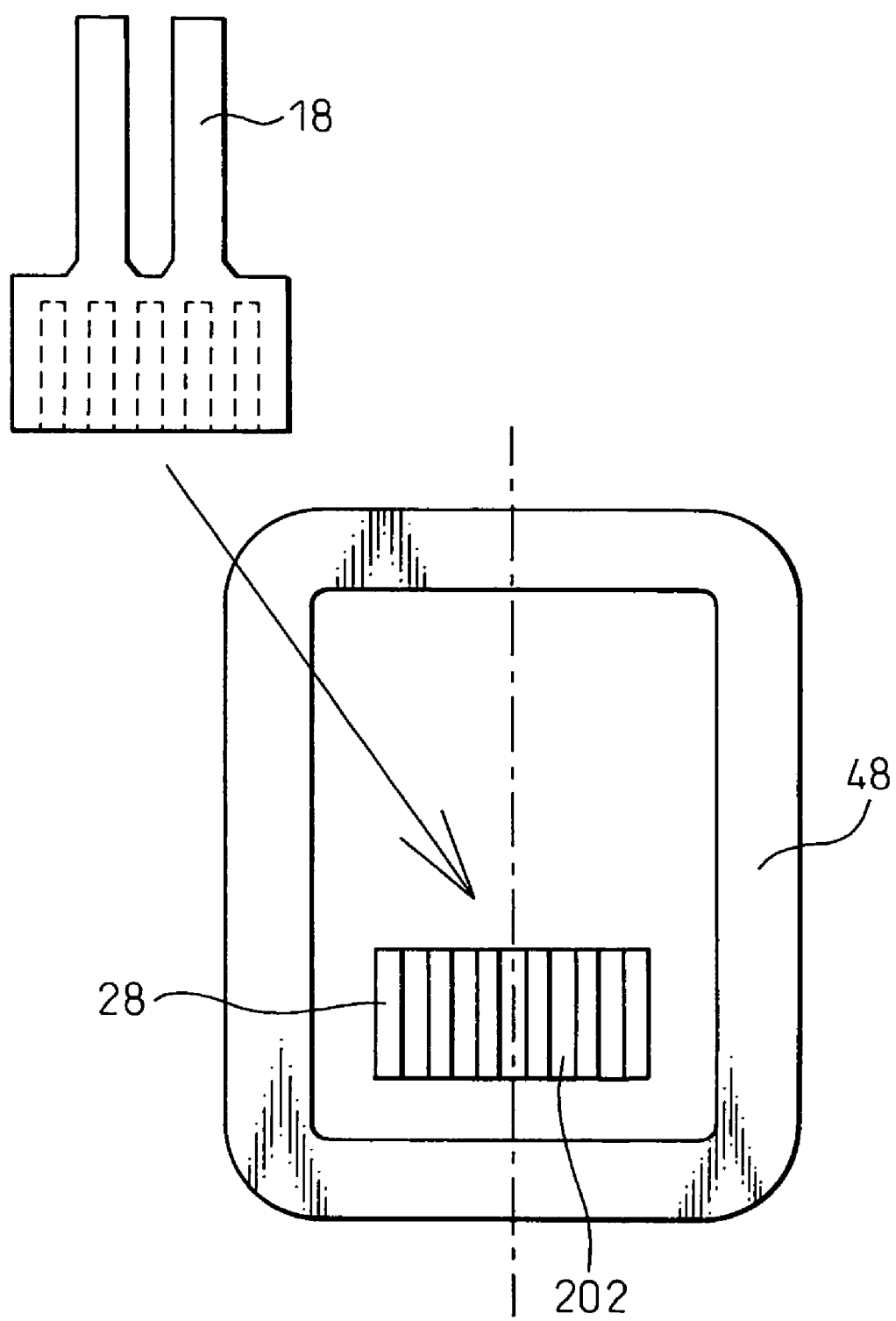
FIG. 23 is a plan view showing the mounting position of the grooved crystal plate and the grooved mounting base in the crystal device according to the ninth embodiment.

FIG. 22 is a perspective view of a package 48 provided with the grooved mounting base 28 in the crystal device according to the present embodiment, and FIG. 23 is a plan view showing the mounting position of the crystal plate 18 and the package 48 provided with the grooved mounting base 28.

As shown in FIG. 22, the package 48 is provided with the mounting base 28 for mounting and supporting the crystal device 18 thereon, and a plurality of equally spaced, fine parallel grooves 202 are formed in the mounting base 28. The grooves 202 formed in the mounting base 28 extend in parallel to the center axis of the package 48, as shown in FIG. 23.

Figure 24:
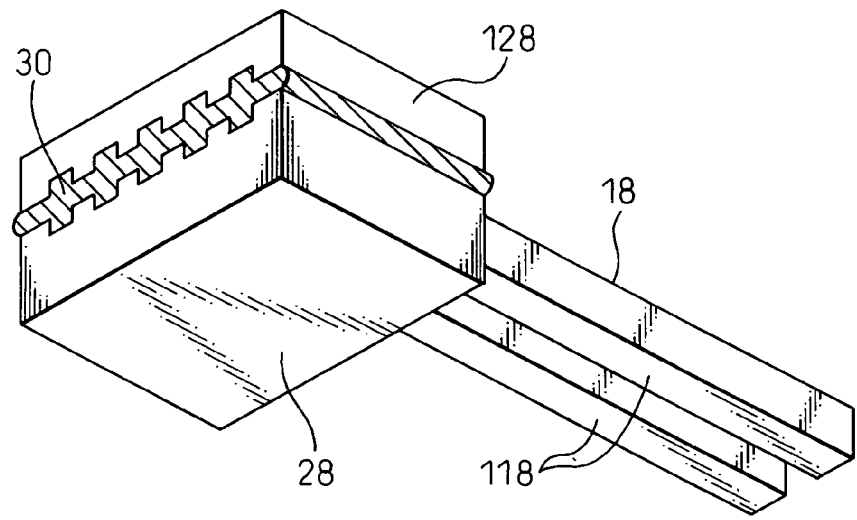
FIG. 24 is a diagram showing the condition in which the grooved crystal plate and the grooved mounting base are bonded together in the crystal device according to the ninth embodiment.

FIG. 24 is a perspective view showing the condition in which the grooved crystal plate 18 is bonded to the grooved mounting base 28.

As shown in FIG. 24, the base portion 128 of the crystal plate 18 is bonded to the mounting base 28 by an adhesive 30. Here, the base portion 128 of the crystal plate 18 is bonded with its grooves 201 (first reference) aligned substantially parallel to the grooves 202 (second reference) formed in the mounting base 28. In FIG. 24, the package 48 is omitted for clarity.

When the crystal plate 18 and the mounting base 28 are bonded together as shown in FIG. 24, as the adhesive 30 immediately after application is in a liquid state, the adhesive 30 permeates so as to flow through the grooves 201 and 202 by capillary action. In the present embodiment, as the grooves are very small in size and large in number, the force generated by the capillary action (the force generally known as a capillary force) is very large; in fact, it is large enough that the crystal plate 18 can be easily moved.

Figure 25:
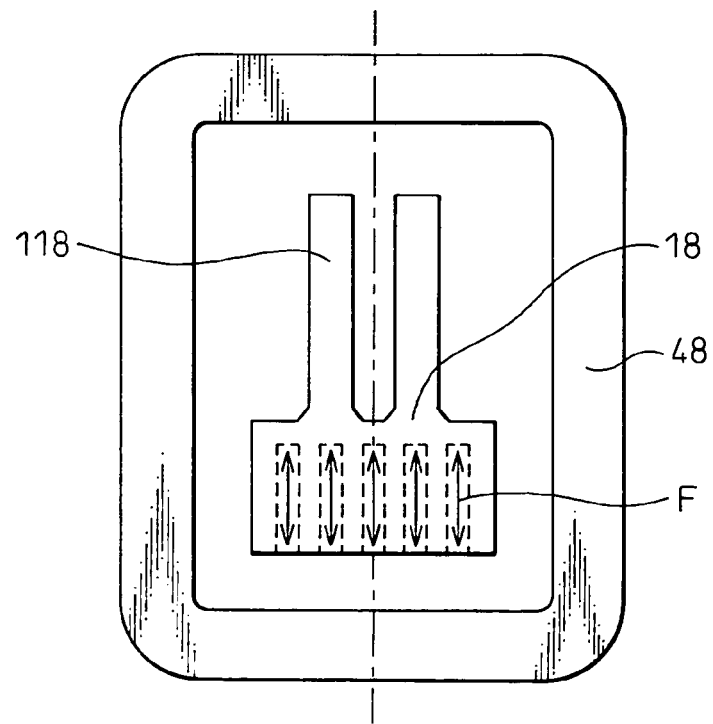
FIG. 25 is a plan view showing the bonding condition of the crystal plate in the crystal device according to the ninth embodiment.

FIG. 25 is a plan view showing the bonding condition of the crystal plate 18.

Figure 26:
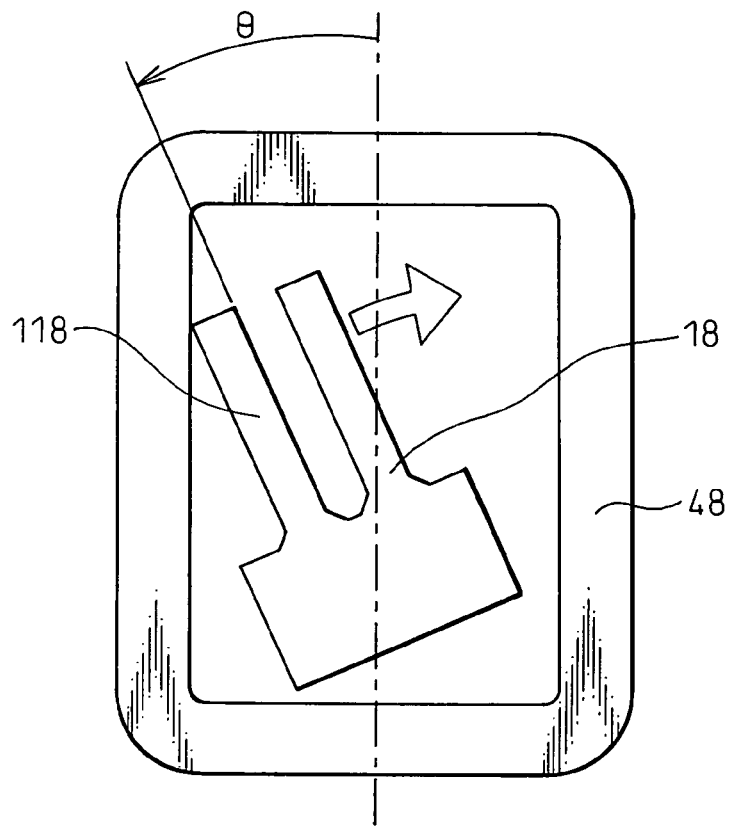
FIG. 26 is a diagram showing the mounting condition of the crystal device.

As shown in FIG. 25, the capillary force F occurs along the grooves. Accordingly, the capillary force F due to the adhesive 30 flowing through the grooves 201 formed in the crystal plate 18 is exerted in the longitudinal direction of the vibrating prongs 118. On the other hand, the capillary force F due to the adhesive 30 flowing through the grooves 202 formed in the mounting base 28 is exerted in the direction parallel to the center axis of the package, i.e., in the direction along which the grooves 202 are formed. Since these two capillary forces F act by combining with each other, if the crystal plate 18 is bonded somewhat obliquely as shown in FIG. 26, the crystal plate 18 is automatically corrected and fixed in place with the longitudinal direction of the vibrating prongs 18 oriented in parallel to the center axis of the package 48, as shown in FIG. 25.

The most important feature of the present embodiment is that the crystal plate 18 is automatically positioned and placed in the prescribed position by using the first reference, the second reference, and the self-alignment due to the capillary forces F occurring in the adhesive.

Here, the fine grooves provided on the crystal plate 18 to generate the capillary force F have been formed by a patterning method using photolithography and a crystal processing method using etching, both being techniques widely used in the field of LSIs. The dimensions can be controlled to micron order tolerances, and the groove width can be reduced to several tens of microns.

The manufacturing method for the crystal device according to the present embodiment will be described below.

First, an etch-resistant film, for example, a gold (Au) film, is deposited over the base portion 128 of the crystal plate 18.

Next, the etch-resistant film is patterned by photolithography, to form a plurality of slit patterns defining the grooves 201.

Next, the plurality of slit patterns are etched using a solution of hydrofluoric acid or the like, thereby forming the grooves 201 of a prescribed depth.

On the other hand, the package 48, the mounting base 28, and the plurality of grooves 202 of the mounting base 28 are integrally formed using a conventional ceramic fabrication method in which a stack of green sheets is sintered to fabricate a desired structure.

The thus formed crystal plate 18 and mounting base 28 are placed face-to-face with the grooves 201 and 202 facing each other, and the adhesive 30 is injected therebetween. Here, a heat-hardenable adhesive is used as the adhesive 30, but a light-hardenable adhesive may be used instead.

After that, the adhesive is harden by heating (or by light radiation if the adhesive is a light-hardenable type), thus bonding the base portion 128 of the crystal plate 28 to the mounting base 28.

With the structure and the manufacturing method described above, the crystal plate 18 can be accurately positioned and bonded in the prescribed position inside the package 48. This eliminates the problem of the crystal plate 18 coming into contact with the package 48, and stable vibration characteristics can be obtained. Furthermore, as the crystal plate 18 does not easily contact the package 48 even if the size of the package 48 is reduced, the overall size of the device can be reduced.

When the crystal device according to the present embodiment is used as a gyro sensor device, there is offered another advantage that the angular velocity can be detected stably with high accuracy.

Figure 27:
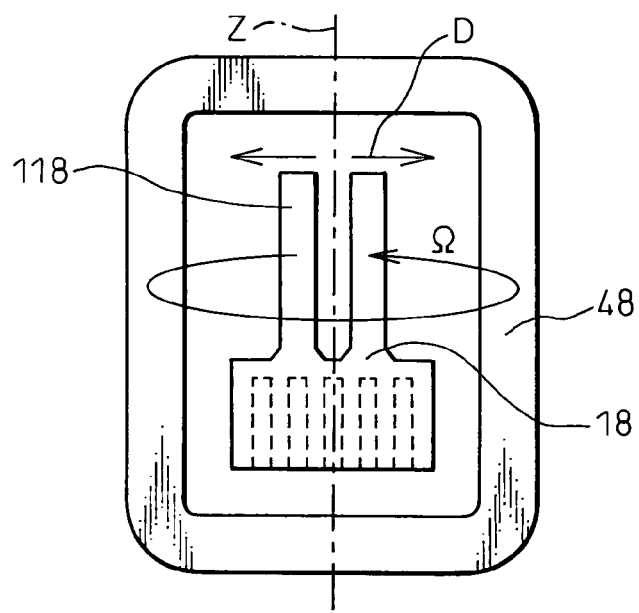
FIG. 27 is a diagram for explaining the case where the crystal device according to the ninth embodiment is used as a gyro sensor device.

FIG. 27 is a plan view showing the mounting position of the crystal plate when the crystal device according to the present embodiment is used as a gyro sensor device.

In the gyro sensor device, when the crystal plate is mounted in the package with its vibrating prongs aligned parallel to the spinning axis Z, and the vibrating prongs are caused to vibrate in the direction of vibration, D, perpendicular to the spinning axis Z, the angular velocity about the spinning axis Z can be detected most accurately.

In the gyro sensor device shown in FIG. 27, the grooves 201 in the base portion of the crystal plate 18 are formed parallel to the longitudinal direction of the vibrating prongs 118. Using an etching method, the grooves 201 can be formed accurately in parallel to the longitudinal direction of the vibrating prongs 118.

On the other hand, in the mounting base 28 provided inside the package 48, the grooves 202 are formed in parallel to the spinning axis Z about which the angular velocity Ω is to be detected.

The base portion 128 of the crystal plate 18 and the mounting base 28 provided inside the package 48 are bonded together with their grooves 201 and 202 oriented in substantially the same direction; in this way, the longitudinal direction of the vibrating prongs 118 can be oriented parallel to the spinning axis Z about which the angular velocity Ω is to be detected.

Accordingly, in the gyro sensor device shown in FIG. 27, the angular velocity can be detected with high accuracy. Furthermore, in the gyro sensor device shown in FIG. 27, it becomes possible to detect the angular velocity stably because the crystal plate can be aligned accurately.

10th Embodiment

Figure 28:
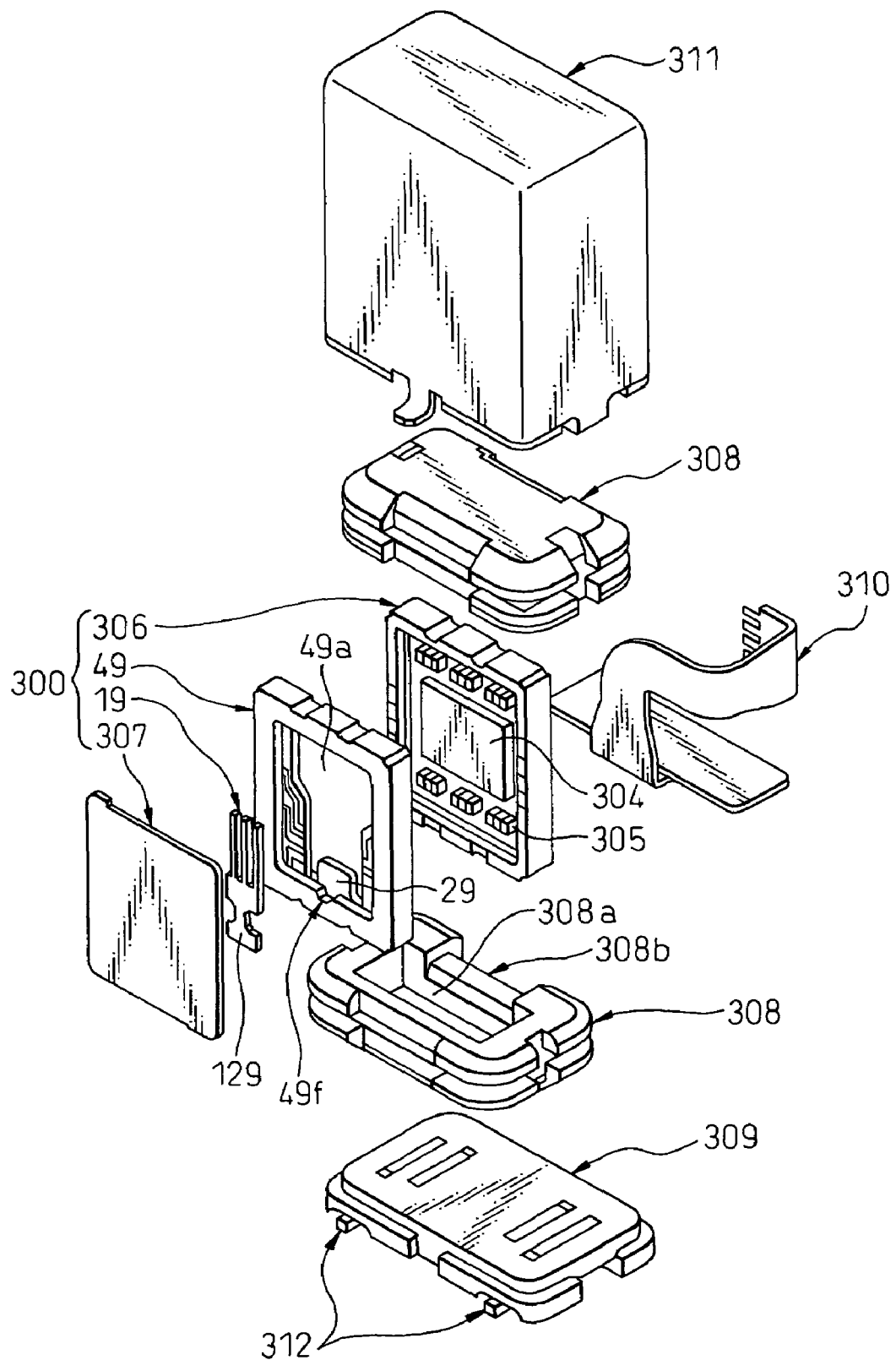
FIG. 28 is an exploded perspective view of a gyro sensor device according to a 10th embodiment.
Figure 29:
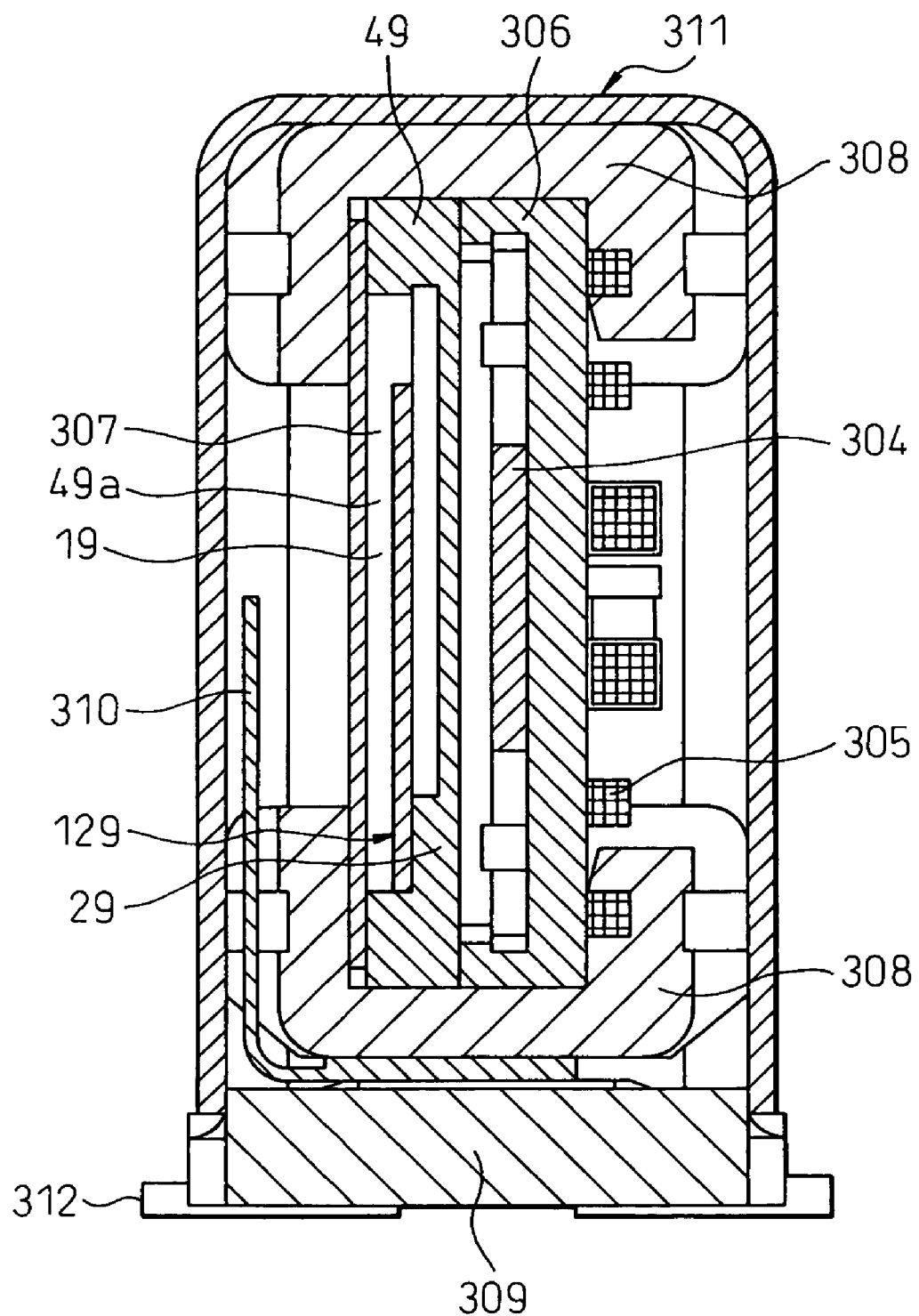
FIG. 29 is a cross-sectional view of the structure shown in FIG. 28.

FIG. 28 is an exploded perspective view of a gyro sensor device according to the present embodiment, FIG. 29 is a cross-sectional view of the gyro sensor device according to the present embodiment, and FIG. 30 is a perspective view showing the condition before a supporting substrate with a crystal plate mounted thereon is installed.

A sensor unit 300 is constructed so that a piezoelectric oscillator (crystal plate) 19 having a plurality of (for example, three) vibrating prongs 119 is fixedly mounted by bonding on one side of the supporting substrate (package) 49 formed, for example, from a multilayer substrate of ceramic or the like. Electrodes formed on the piezoelectric oscillator 19 are connected by means of wires to a wiring mounting base 49c formed on the supporting substrate 49. A substrate 306, on which electronic components, such as an IC chip 304 and chip components 305 having the functions of a driver circuit and a detection circuit for the piezoelectric oscillator 19, are surface-mounted, is fixed by soldering to the opposite side of the supporting substrate 49. The piezoelectric oscillator 19 is covered with a metal seal cover 307, and sealed in a vacuum.

Supporting recesses 308a for accommodating the top and bottom ends of the sensor unit 300 are formed in the facing sides of a pair of vibration absorbing members 308 formed from butyl-based rubber or the like. A recess 308b for accommodating a wiring member 310 is formed along the direction of wiring in a side face of the vibration absorbing member 308 located nearer to a lid 309. The wiring member 310 is constructed from a FPC having a flexible structure, and the wiring is arranged on one side of the FPC. The supporting recesses 308a of the vibration absorbing members 308 are formed so as to be able to securely hold six faces including the top and bottom ends of the sensor unit 300.

The sensor unit 300, the vibration absorbing members 308, and the wiring member 310 are housed inside a metal case 311. The lid 309, which is made of a resin material, is provided with a plurality of external connection terminals 312 for connecting to the wiring member 310. The external connection terminals 312 are bent so as to protrude outward.

FIG. 31A is a plan view showing the condition in which the piezoelectric oscillator is bonded to the mounting base of the supporting substrate, and FIG. 31B is a cross-sectional view thereof.

The supporting substrate 49 is a ceramic package formed from a stack of ceramic layers having a recess 49a, and has a substantially rectangular plan shape; the mounting base 29 is formed on one of the shorter sides of the rectangle. The wiring mounting base 49c on which wiring patterns are formed is provided inside the recess 49a, and a groove 49d for storing a spillover of the adhesive 30 is formed between the mounting base 29 and the wiring mounting base 49c. A recess (notch) 49f for preventing contact with a burr 129b remaining on a side face of the base portion 129 of the piezoelectric oscillator 19 is formed in a side wall portion 49e near the mounting base 29 formed on the supporting substrate 49. The burr 129b refers to any protruding portion remaining on the piezoelectric oscillator 19 when the piezoelectric oscillator 19 is produced as one of many parts produced in a multi-cavity mold. The width (Wd) of the mounting base 29 formed on the supporting substrate 49 is made substantially equal to the width (W) of the base portion 129 of the piezoelectric oscillator 19. If there is no such burr 129b on the piezoelectric oscillator 19, the recess (notch) 49f effectively serves as an area for storing a spillover of the adhesive 30.

The adhesive 30 is applied over the plane face of the mounting base 29, and the plane face of the base portion 129 of the piezoelectric oscillator 19 is placed onto the adhesive 30; then, the adhesive 30 is hardened thereby fixedly bonding the base portion 129 of the piezoelectric oscillator 19 to the mounting base 29 formed on the supporting substrate 49. It has been verified that, at this time, the self-alignment function of the adhesive works so that the inclination (α) of the piezoelectric oscillator 19 is held within a desired tolerance range (for example, within ±5°), ensuring the required detection accuracy of the gyro sensor device. In the present embodiment, a silicone-based adhesive (viscosity: 12 Pa·s) has been used as the adhesive 30, but an epoxy-based adhesive (viscosity: 3 to 4 Pa·s) may be used instead.

According to an experiment conducted by the present applicant, the relation 0.86W<Wd<1.16W must be satisfied between the width (Wd) of the mounting base 29 and the width (W) of the base portion 129 of the piezoelectric oscillator 19 in order to hold the inclination (α) of the piezoelectric oscillator 19 within the desired tolerance range (for example, within ±5°) by relying on the self-alignment function of the adhesive 30.

Figure 32A:
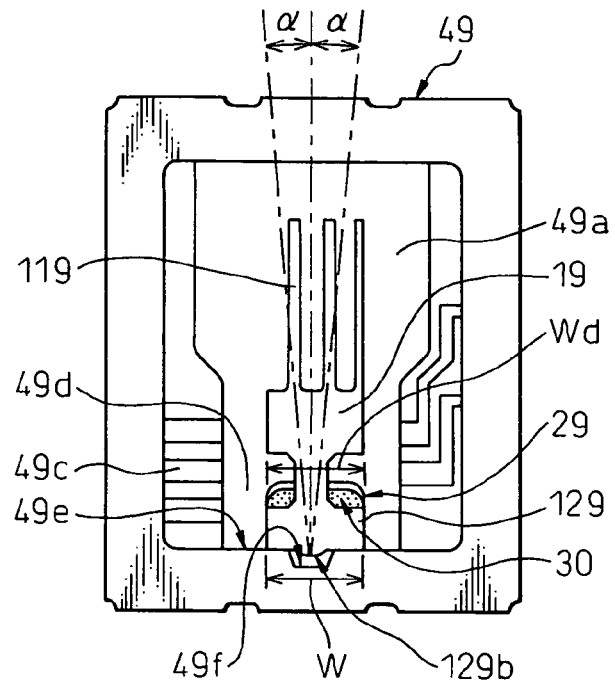
FIG. 32A is a plan view showing the condition in which the piezoelectric oscillator is bonded to the mounting base of the supporting substrate shown in FIG. 28.
Figure 32B:
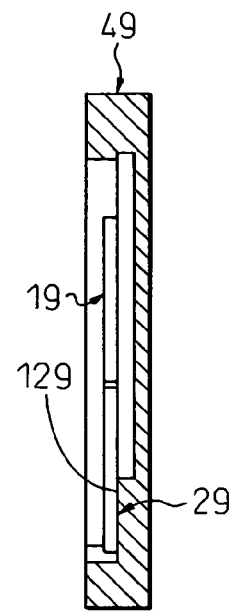
FIG. 32B is a cross-sectional view thereof.
Figure 33:
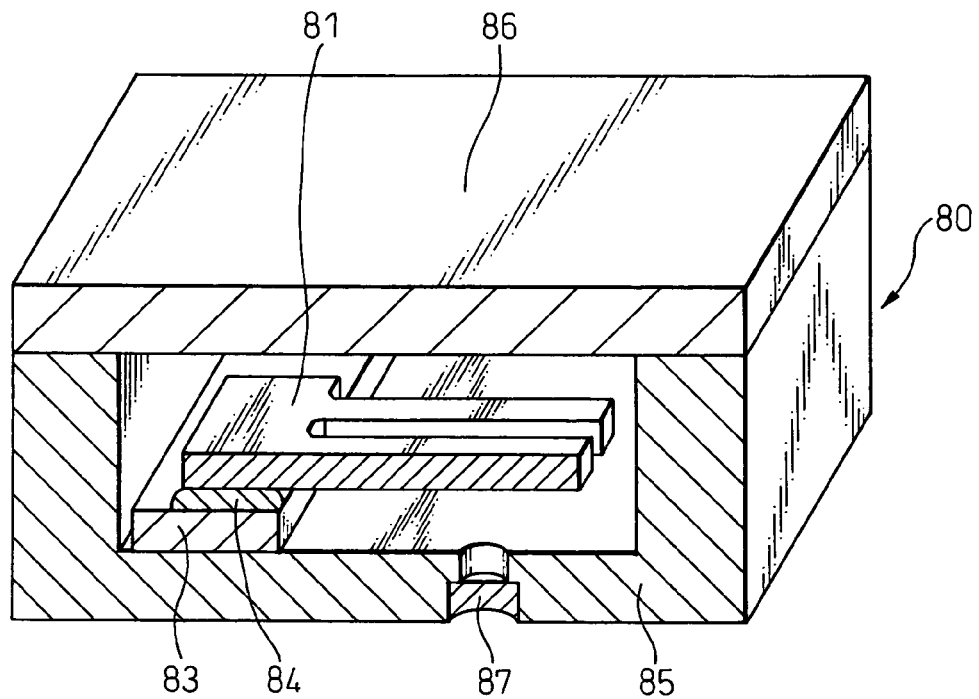
FIG. 33 is a cross-sectional view of an essential portion schematically showing the structure of a prior art crystal oscillator.
Figure 34A:
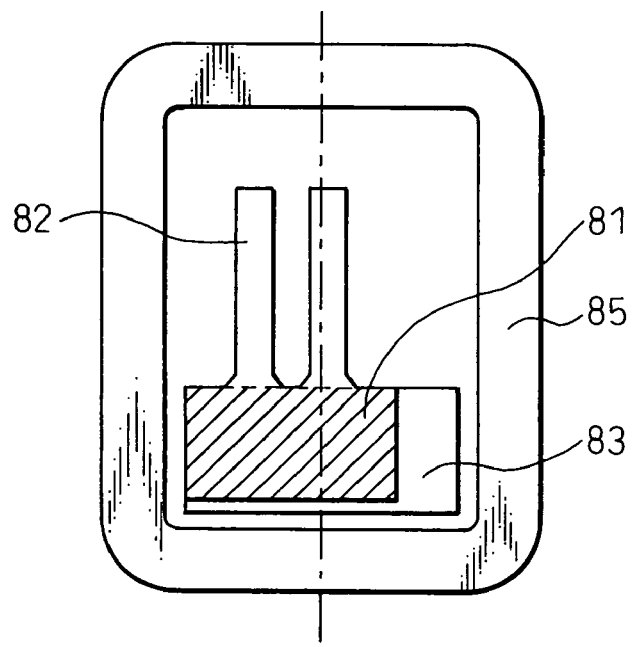
FIGS. 34A and 34B are diagrams each showing an example of bonding failure of a crystal plate in the crystal oscillator.
Figure 34B:
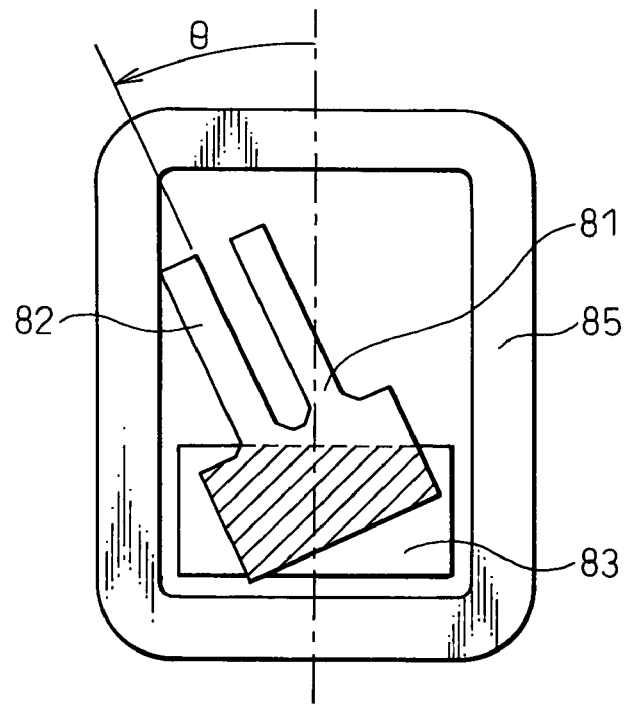
Figure 35:
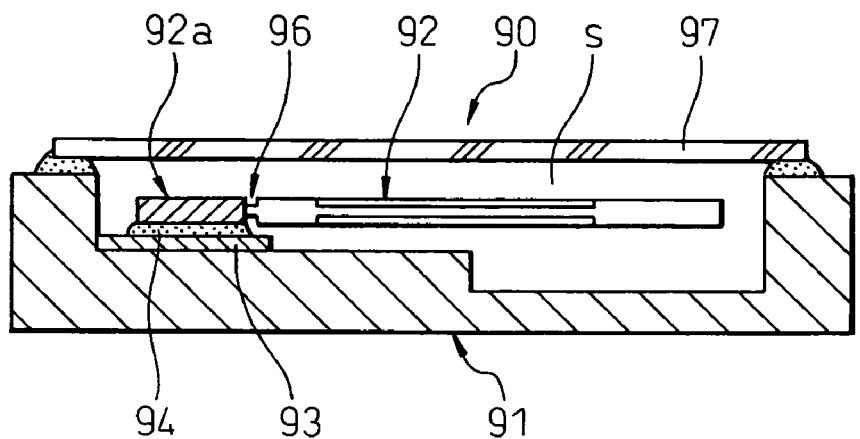
FIG. 35 is a cross-sectional view schematically showing the structure of a prior art piezoelectric device.
Figure 36:
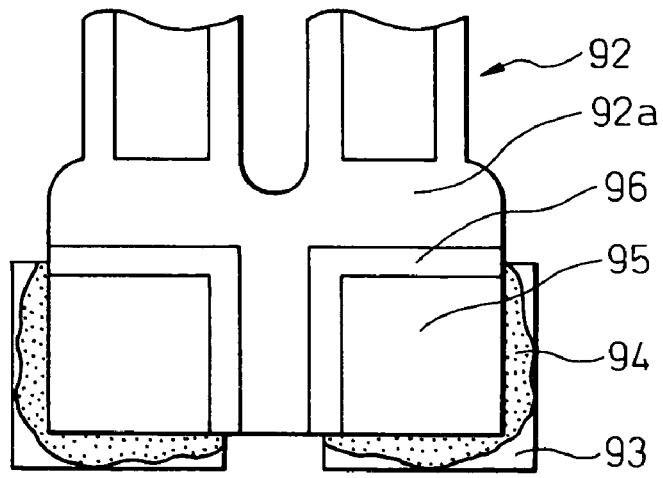
FIG. 36 is an enlarged view of a bonding portion in the piezoelectric device shown in FIG. 35.

FIG. 32A is a plan view showing the condition in which the piezoelectric oscillator is bonded to the mounting base of the supporting substrate, and FIG. 32B is a cross-sectional view thereof.

The mounting base 29 formed on the supporting substrate 49 has a width substantially equal to that of the base portion 129 of the piezoelectric oscillator 19. Further, as shown in FIG. 32A, the base portion 129 of the piezoelectric oscillator 19 contacts the side wall portion 49e of the supporting substrate 49, but since the burr 129b on the base portion 129 enters the recess 49f formed in the side wall portion 49e, the piezoelectric oscillator 19 is prevented from being inclined with the burr 129b coming into contact with the side wall portion 49e.

In the gyro sensor device according to the present embodiment, the width (Wd) of the mounting base 29 formed on the supporting substrate 49 is made substantially equal to the width (W) of the base portion 129 of the piezoelectric oscillator 19, and the recess (notch) 49f is formed in the side wall portion 49e near the mounting base 29 formed on the supporting substrate 49. Further, the adhesive 30 is applied over the plane face of the mounting base 29, and the base portion 129 of the piezoelectric oscillator 19 is placed on it as shown in FIG. 32; accordingly, due to the self alignment effect, the piezoelectric oscillator 19 is pulled by the adhesive 30 not only in the width direction but also in the longitudinal direction, thus accomplishing the positioning. That is, the burr 129*b* remaining on the side face of the base portion 129 of the piezoelectric oscillator 19 is accommodated in the recess (notch) 49*f* formed in the side wall portion 49*e* of the supporting substrate 49, and the side face of the base portion 129 is in contact with the side wall portion 49*e* of the supporting substrate 49; in this condition, the piezoelectric oscillator 19 is bonded in place with its inclination (α) held within the desired tolerance range (for example, within ±5°). A spillover of the adhesive 30 can be stored in the groove 49*d* formed between the mounting base 29 and the wiring mounting base 49*c*.

In this way, the invention can provide a gyro sensor device that satisfies the required detection accuracy. The invention can also provide a gyro sensor device having stable performance relatively free from manufacturing variations.

In the present embodiment, the base portion 129 of the piezoelectric oscillator 19 has a plan shape formed by an outline having three straight line portions 19*i*, 19*j*, and 19*k*, as shown in FIG. 30. The straight line portions 19*i* and 19*k* are parallel to each other with a uniform spacing W, while the straight line portion 19*j* is perpendicular to the straight line portions 19*i* and 19*k*. The straight line portion 19*j* has the above-mentioned burr 129*b* at its center.

On the other hand, the upper face of the mounting base 29, i.e., the face to which the base portion 129 of the piezoelectric oscillator 19 is to be bonded, has a rectangular plan shape formed by an outline having three straight line portions 29*i*, 29*h*, and 29*k* and a straight line portion formed along the side wall portion 49*e* of the supporting substrate 49. The straight line portions 29*i* and 29*k* are parallel to each other with a substantially uniform spacing W. The straight line portion 29*h* and the straight line portion formed along the side wall portion 49*e* of the supporting substrate 49 are perpendicular to the straight line portions 29*i* and 29*k*. The straight line portion formed along the side wall portion 49*e* of the supporting substrate 49 is provided at its center with the previously mentioned recess (notch) 49*f*.

In the above structure also, positioning relatively free from placement errors can be accomplished by performing the positioning while recognizing the positions of the three straight line portions 19*i*, 19*j*, and 19*k* (first reference) of the base portion 129 of the piezoelectric oscillator 19 and the positions of the three straight line portions (second reference), i.e., the straight line portions 29*i* and 29*k* of the mounting base 29 and the straight line portion formed along the side wall portion 49*e* of the supporting substrate 49. Further, using the first reference, the second reference, and the self-alignment effect of the adhesive 30, the two straight line portions 19*i* and 19*k* of the base portion 129 of the piezoelectric oscillator 19 are accurately aligned with the two straight line portions 29*i* and 29*k* of the mounting base 29, as shown in FIG. 30, and accurate positioning is accomplished with the straight line portion 19*j* of the base portion 129 of the piezoelectric oscillator 19 and the straight line portion formed along the side wall portion 49*e* of the supporting substrate 49 being pulled as shown in FIG. 13B. Accordingly, the positioning accuracy can be greatly increased compared with any prior known method.

While the above embodiments have been described by dealing with a crystal plate, it will be understood that the present invention can also be applied to other types of oscillator. Further, in the above embodiments, the crystal plate has been described as having a plurality of vibrating prongs, but the present invention can also be applied to oscillators having only one vibrating prong.

What is claimed is:

1. An oscillator device comprising:
   an oscillator having a vibrating prong and a base portion with a first reference portion;
   a package;
   a mounting base with a second reference portion provided inside said package; and
   a bonding material for fixing said oscillator to said mounting base by aligning said first reference portion with said second reference portion by utilizing a self-alignment effect occurring due to surface tension,
   wherein said second reference portion is formed by inclining at a certain angle with respect to a center line of said package.

2. The oscillator device according to claim 1, wherein said first reference portion has three straight line portions defining an outer shape of said base portion, and said second reference portion has three straight line portions corresponding in position to said three straight line portions that constitute said first reference portion.

3. The oscillator device according to claim 2, wherein one of said three straight line portions constituting said second reference portion is a contact line between an inside wall of said package and said mounting base.

4. The oscillator device according to claim 1, wherein said first reference portion has two side wall faces defining an outer shape of said oscillator, and said second reference portion has two bonding faces corresponding to said two side wall faces.

5. The oscillator device according to claim 1, wherein said first reference portion has three straight line portions defining an outer shape of said oscillator, said second reference portion has two straight line portions corresponding in position to at least two of said straight line portions constituting said first reference portion, and an inside wall of said package has a bonding face corresponding to at least one of said straight line portions constituting said first reference portion.

6. The oscillator device according to claim 5, wherein width (W) of said base portion and width (Wd) of said mounting base satisfy the relation $0.86W<Wd<1.16W$.

7. The oscillator device according to claim 6, wherein the width of said base portion is substantially equal to the width of said mounting base.

8. The oscillator device according to claim 5, wherein said package is a ceramic package.

9. The oscillator device according to claim 1, wherein said oscillator is a crystal plate.

10. A method for manufacturing an oscillator device, comprising the steps of:
    forming an oscillator having a vibrating prong and a base portion with a first reference portion;
    forming a package having a mounting base with a second reference portion which is formed by inclining at a certain angle with respect to a center line of said package;
    placing said oscillator on said mounting base by aligning said first reference portion with said second reference portion by utilizing a self-alignment effect occurring due to surface tension of a bonding material; and
    hardening said bonding material.

11. The method for manufacturing an oscillator device according to claim 10, wherein said first reference portion is formed so as to have three straight line portions defining an outer shape of said base portion, and said second reference portion is formed so as to have three straight line portions corresponding in position to said three straight line portions that constitute said first reference portion.

12. The method for manufacturing an oscillator device according to claim 11, wherein one of said three straight line portions constituting said second reference portion is a contact line between an inside wall of said package and said mounting base.

13. The method for manufacturing an oscillator device according to claim 10, wherein said first reference portion is formed so as to have two side wall faces defining an outer shape of said oscillator, and said second reference portion is formed so as to have two bonding faces corresponding to said two side wall faces.

14. The method for manufacturing an oscillator device according to claim 10, wherein said oscillator is formed by etching.

15. The method for manufacturing an oscillator device according to claim 10, wherein said mounting base is formed integrally with said package.

16. The method for manufacturing an oscillator device according to claim 10, wherein said first reference portion is formed so as to have three straight line portions defining an outer shape of said crystal plate, and said second reference portion is formed so as to have two straight line portions corresponding in position to at least two of said straight line portions constituting said first reference portion, while an inside wall of said package is formed so as to have a bonding face corresponding to at least one of said straight line portions constituting said first reference portion.

17. The method for manufacturing an oscillator device according to claim 16, wherein width (w) of said base portion and width (wd) of said mounting base satisfy the relation 0.86W<Wd<1.16W.

18. The method for manufacturing an oscillator device according to claim 17, wherein said base portion is formed so as to have a width substantially equal to the width of said mounting base.

19. The method for manufacturing an oscillator device according to claim 16, wherein said package is a ceramic package.

20. The method for manufacturing an oscillator device according to claim 10, wherein said oscillator is a crystal plate.

21. The oscillator device according to claim 1, wherein said certain angle is an angle such that, when said oscillator device is mounted in an apparatus, a longitudinal direction of said vibrating prong is parallel to a predefined spinning axis of said oscillator device.

22. The method for manufacturing an oscillator device according to claim 10, wherein said certain angle is an angle such that, when said oscillator device is mounted in an apparatus, a longitudinal direction of said vibrating prong is parallel to a predefined spinning axis of said oscillator device.

* * * * *